US012667018B2

(12) United States Patent
Wen et al.

(10) Patent No.: US 12,667,018 B2
(45) Date of Patent: Jun. 23, 2026

(54) SEMICONDUCTOR DEVICE INCLUDING MULTI-DIMENSION THROUGH SILICON VIA STRUCTURES FOR BACKSIDE ALIGNMENT AND THERMAL DISSIPATION

(71) Applicant: Taiwan Semiconductor Manufacturing Company, Ltd., Hsinchu (TW)

(72) Inventors: Ke-Gang Wen, Hsinchu (TW); Tsung-Chieh Hsiao, Shetou Township (TW); Liang-Wei Wang, Hsinchu City (TW); Dian-Hau Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 529 days.

(21) Appl. No.: 18/307,580

(22) Filed: Apr. 26, 2023

(65) Prior Publication Data

US 2024/0145435 A1 May 2, 2024

Related U.S. Application Data

(60) Provisional application No. 63/381,395, filed on Oct. 28, 2022.

(51) Int. Cl.
*H10W 90/00* (2026.01)
*H10D 88/00* (2026.01)
(Continued)

(52) U.S. Cl.
CPC ............ *H10W 90/00* (2026.01); *H10D 88/00* (2025.01); *H10W 20/023* (2026.01);
(Continued)

(58) Field of Classification Search
CPC .......... H01L 25/0657; H01L 21/76898; H01L 23/481; H01L 23/585; H01L 2225/06544;
(Continued)

(56) References Cited

U.S. PATENT DOCUMENTS

| | | | |
|---|---|---|---|
| 7,456,507 | B2 | 11/2008 | Yang |
| 10,283,461 | B1 | 5/2019 | Wang et al. |

(Continued)

FOREIGN PATENT DOCUMENTS

| | | |
|---|---|---|
| CN | 101000909 A | 7/2007 |
| TW | 201926487 A | 7/2019 |
| TW | 202234586 A | 9/2022 |

*Primary Examiner* — Herve-Louis Y Assouman

(74) *Attorney, Agent, or Firm* — Harrity & Harrity, LLP

(57) ABSTRACT

Some implementations described herein include systems and techniques for fabricating a multi-dimension through silicon via structure in a three-dimensional integrated circuit device. The multi-dimension through silicon via structure includes a first columnar structure having a first width and a second columnar structure including a second width that is greater relative to the first width. The first columnar structure may include a low electrical capacitance and be configured for electrical signaling within the three-dimensional integrated circuit device. The second columnar structure may be configured to provide power to integrated circuitry of the three-dimensional integrated circuit device and also be configured to conduct heat through the three-dimensional integrated circuit device for thermal management of the three-dimensional integrated circuit device. Additionally, a pattern including the second columnar structure may be used for alignment purposes.

20 Claims, 28 Drawing Sheets

(51) Int. Cl.

| | |
|---|---|
| *H10W 20/00* | (2026.01) |
| *H10W 20/20* | (2026.01) |
| *H10W 42/00* | (2026.01) |
| *H10W 46/00* | (2026.01) |
| *H10W 80/00* | (2026.01) |
| *H10W 90/20* | (2026.01) |

(52) U.S. Cl.
CPC ........... *H10W 20/20* (2026.01); *H10W 42/00* (2026.01); *H10W 90/297* (2026.01)

(58) Field of Classification Search
CPC ......... H01L 2223/54426; H01L 23/544; H01L 2224/08146; H01L 2224/80138; H01L 25/50; H01L 2225/06541; H01L 2225/06589; H10D 88/00
See application file for complete search history.

(56) References Cited

U.S. PATENT DOCUMENTS

| | | | |
|---|---|---|---|
| 2014/0084476 A1* | 3/2014 | Lin ..................... | H01L 25/0756 257/774 |
| 2017/0025384 A1* | 1/2017 | Park ..................... | H01L 23/481 |
| 2021/0082873 A1* | 3/2021 | Chen ..................... | H01L 24/00 |
| 2022/0262695 A1 | 8/2022 | Chang | |
| 2022/0302085 A1 | 9/2022 | Chang et al. | |

* cited by examiner

206

300

206

500

502

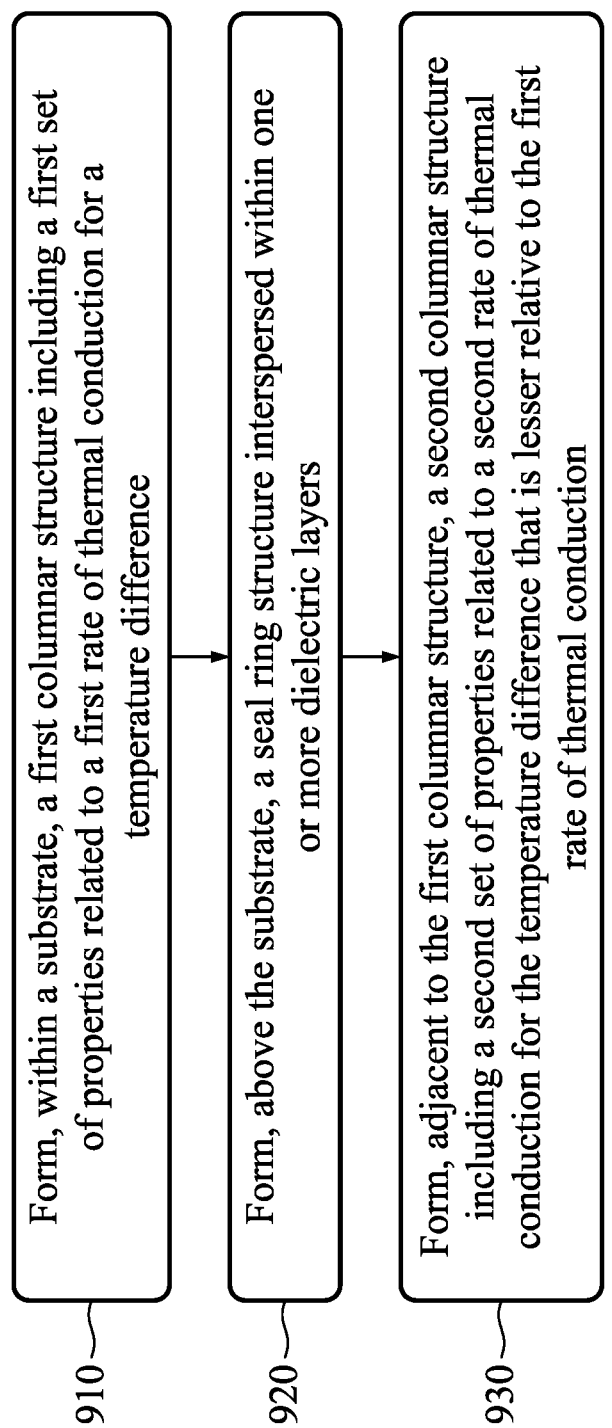

900

910 — Form, within a substrate, a first columnar structure including a first set of properties related to a first rate of thermal conduction for a temperature difference 920 — Form, above the substrate, a seal ring structure interspersed within one or more dielectric layers 930 — Form, adjacent to the first columnar structure, a second columnar structure including a second set of properties related to a second rate of thermal conduction for the temperature difference that is lesser relative to the first rate of thermal conduction

FIG. 9

SEMICONDUCTOR DEVICE INCLUDING MULTI-DIMENSION THROUGH SILICON VIA STRUCTURES FOR BACKSIDE ALIGNMENT AND THERMAL DISSIPATION

CROSS-REFERENCE TO RELATED APPLICATION

This Patent Application claims priority to Provisional Patent Application No. 63/381,395, filed on Oct. 28, 2022, and entitled "Semiconductor Device Including Multi-Dimension Through Silicon Via Structures for Backside Alignment and Thermal Dissipation." The disclosure of the prior Application is considered part of and is incorporated by reference into this Patent Application.

BACKGROUND

A three dimension integrated circuit device (3DIC device) may include a stack of multiple integrated circuit (IC) dies. In some implementations, the 3DIC device may include through silicon via (TSV) interconnect structures to transmit signals between the multiple IC dies. Additionally, the TSV interconnect structures may conduct heat generated by circuitry of the IC dies to an environment external to the 3DIC device for dissipation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart of an example process associated with forming a semiconductor structure described herein.

DETAILED DESCRIPTION

Figure 1:
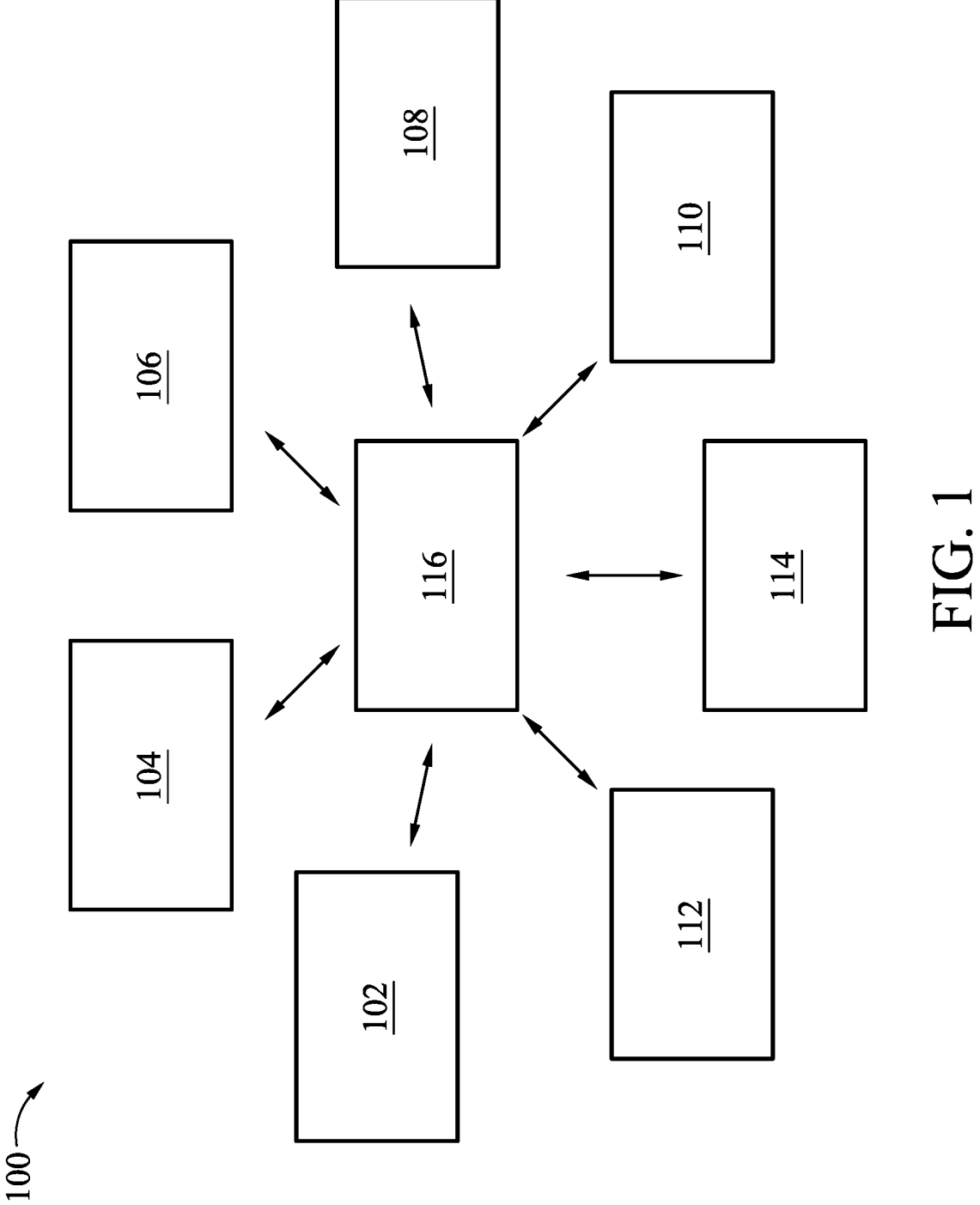
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, formation of a 3DIC device may include the use of a temporary carrier to transport a silicon wafer (e.g., a silicon substrate) including IC dies used to form the 3DIC device. During a bonding operation that bonds two silicon wafers together, a first silicon wafer may be inverted on the temporary carrier. While inverted, an alignment marker near a first surface of the first silicon wafer that is joined to a second surface of the temporary carrier may be obscured from a vision system that aligns the first silicon wafer to the second silicon wafer.

Additionally, the 3DIC device and/or the IC dies include through silicon via (TSV) interconnect structures to transmit signals between integrated circuitry of the IC dies. For thermal performance purposes, the TSV structures may also conduct heat generated by the integrated circuitry to an environment external to the 3DIC device for dissipation. Further, and to supplement the thermal performance provided by TSV structures, a thickness of silicon substrates of the IC dies may be increased to increase a thermal capacitance and/or a heat sinking capability of the 3DIC device.

Due to the inversion of the first silicon wafer of the temporary carrier (and the obscurement of the alignment marker), achieving a degree of alignment sufficient for a successful bonding operation between the first silicon wafer and the second silicon wafer may be compromised. Further, as process technology nodes advance, an aspect ratio related to a small width TSV structure (e.g., a thickness of a silicon substrate to a width of a TSV structure that is less than approximately 6 microns, among other examples) may introduce challenges with maintaining or increasing a thickness of a silicon wafer including the TSV structure for thermal performance considerations. Additionally, as the width of the TSV structure decreases, the TSV structure may have a thermal performance (e.g., a thermal conductivity, among other examples) that is insufficient to maintain a temperature (e.g., a diode junction temperature, among other examples) within the 3DIC device at or below a threshold that reduces a likelihood of damage to the 3DIC device.

Some implementations described herein include systems and techniques for fabricating a multi-dimension TSV structure in a 3DIC device. The multi-dimension TSV structure includes a first columnar structure having a first width and a second columnar structure including a second width that is greater relative to the first width. The first columnar structure may include a low electrical capacitance and be configured for electrical signaling within the 3DIC device. The second columnar structure may be configured to provide power to integrated circuitry of the 3DIC device and also be configured to conduct heat through the 3DIC device for thermal management of the 3DIC device. Additionally, a pattern including the second columnar structure may be used for alignment purposes.

Using the multi-dimension TSV structure including the first and second columnar structures may increase a rate of heat transfer from the 3DIC device relative another 3DIC device including a single-dimension TSV structure that is designed for electrical signaling. In this way, the 3DIC device may realize an increase in a thermal performance (e.g., maintain a junction temperature under a high-temperature operating condition, maintain a computing rate under a high-temperature operating condition, and/or experience a prolonged useful life, among other examples). Further, a location of the second columnar structure may allow a size of the 3DIC device to be reduced, and a pattern including the second columnar structure may be used for alignment purposes. Such a reduction in the size of the 3DIC device, and/or use of the pattern for alignment purposes, may translate into to a reduction in resources (e.g., manufacturing tools, materials, and or computing resources, among other examples) required to produce a volume of 3DIC devices relative to producing a volume of 3DIC devices not including the multi-dimension TSV structure.

FIG. 1 is a diagram of an example environment 100 in which systems and/or methods described herein may be implemented. As illustrated in FIG. 1, environment 100 may include a plurality of semiconductor processing tools 102-114 and a wafer/die transport tool 116. The plurality of semiconductor processing tools 102-114 may include a deposition tool 102, an exposure tool 104, a develop tool 106, an etch tool 108, a planarization tool 110, a bonding tool 112, a connection tool 114, and/or another type of semiconductor processing tool. The tools included in example environment 100 may be included in a semiconductor clean room, a semiconductor foundry, a semiconductor processing facility, and/or manufacturing facility, among other examples.

Additionally, or alternatively, one or more portions of the example environment 100 may be included in a front end of line (FEOL) manufacturing environment, corresponding to a first portion of a semiconductor manufacturing flow that is directed towards fabricating features related to integrated circuitry. Additionally, or alternatively, one or more portions of the example environment 100 may be included in a middle end of line (MEOL) manufacturing environment, corresponding to a second portion of the semiconductor manufacturing flow that is directed towards fabricating features related to contact structures. Additionally, or alternatively, one or more portions of the example environment 100 may be included in a back end of line (BEOL) manufacturing environment, corresponding to a third portion of the semiconductor manufacturing flow that is directed towards fabricating features related to interconnect structures.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The develop tool 106 is a semiconductor processing tool that is capable of developing a photoresist layer that has been exposed to a radiation source to develop a pattern transferred to the photoresist layer from the exposure tool 104. In some implementations, the develop tool 106 develops a pattern by removing unexposed portions of a photoresist layer. In some implementations, the develop tool 106 develops a pattern by removing exposed portions of a photoresist layer. In some implementations, the develop tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The bonding tool 112 is a semiconductor processing tool that is capable of bonding two or more semiconductor substrates (e.g., two or more wafers, or two or more semiconductor dies) together. For example, the bonding tool 112 may include a eutectic bonding tool that is capable of forming a eutectic bond between two or semiconductor substrates. In these examples, the bonding tool 112 may heat the two or more semiconductor substrates to form a eutectic system between the materials of the two or more wafers.

The connection tool 114 is a semiconductor processing tool that is capable of forming connection structures (e.g., electrically-conductive structures) on an integrated circuit die. The connection structures formed by the connection tool 114 may include a wire, a stud, a pillar, a bump, or a solderball, among other examples. The connection structures formed by the connection tool 114 may include materials such as a gold (Au) material, a copper (Cu) material, a silver (Ag) material, a nickel (Ni) material, a tin (Sn) material, or a palladium (Pd) material, among other examples. The connection tool 114 may include a bumping tool, a wirebond tool, or a plating tool, among other examples.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the environment 100 includes a plurality of wafer/die transport tools 116.

For example, the wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described in connection with FIGS. 2A-9 and elsewhere herein, the semiconductor processing tools 102-114 may perform a combination of operations to form a device including multi-dimension TSV structures for backside alignment and thermal dissipation. The series of operations includes forming, within a substrate, a first columnar structure including a first set of properties related to a first rate of thermal conduction for a temperature difference. The series of operations includes forming, above the substrate, a seal ring structure interspersed within one or more dielectric layers. The series of operations includes forming, adjacent to the first columnar structure, a second columnar structure including a second set of properties related to a second rate of thermal conduction that is lesser relative to the first rate of thermal conduction.

The number and arrangement of semiconductor processing tools shown in FIG. 1 are provided as one or more examples. In practice, there may be additional semiconductor processing tools, different semiconductor processing tools, or differently arranged semiconductor processing tools than those shown in FIG. 1. Furthermore, two or more semiconductor processing tools shown in FIG. 1 may be implemented within a single tool set, or a tool set shown in FIG. 1 may be implemented as multiple, distributed semiconductor processing tools. Additionally, or alternatively, one or more semiconductor processing tools of environment 100 may perform one or more functions described as being performed by another tool set of environment 100.

Figure 2A:
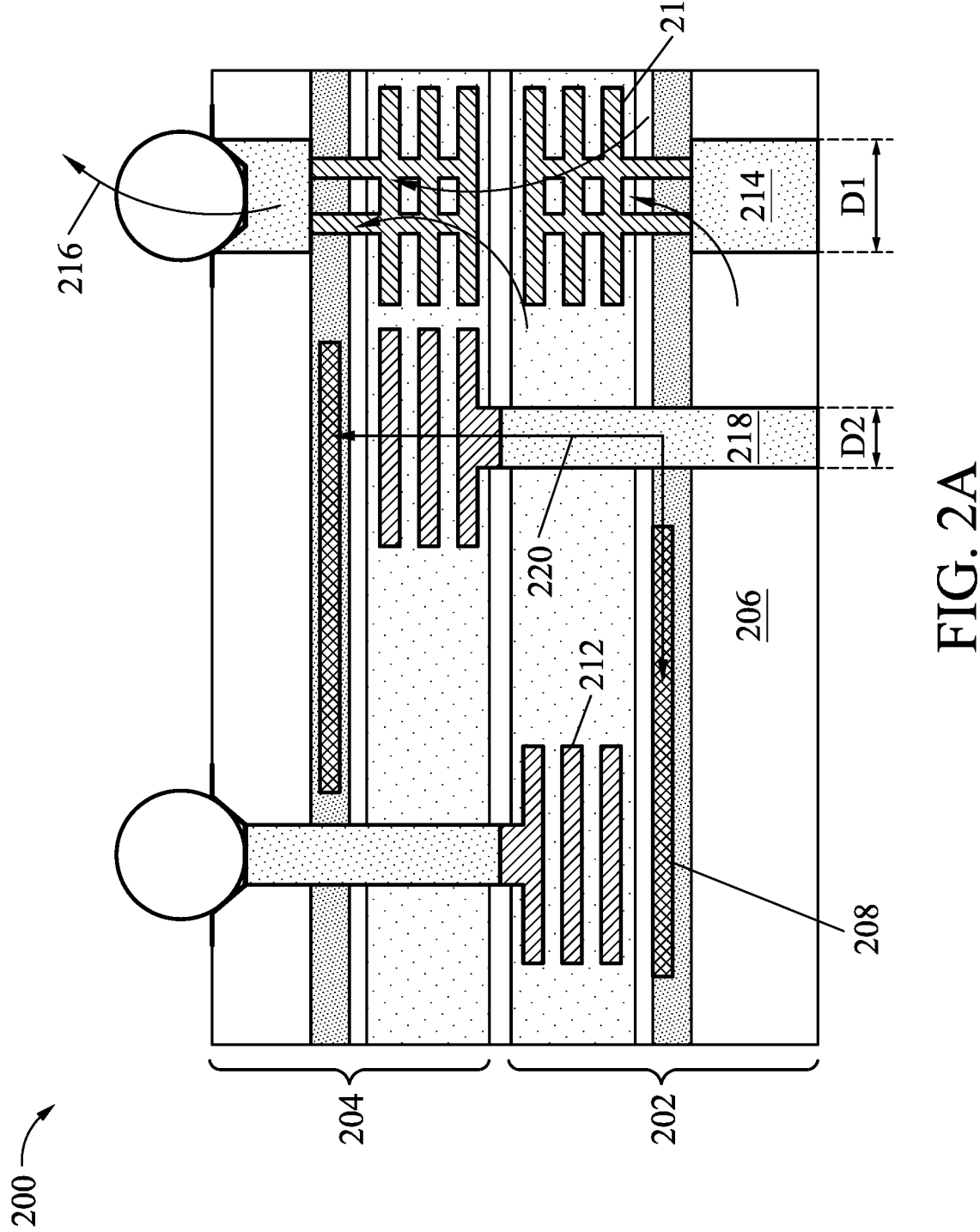
FIGS. 2A-2C are diagrams of an example device including example semiconductor structures described herein.
Figure 2B:
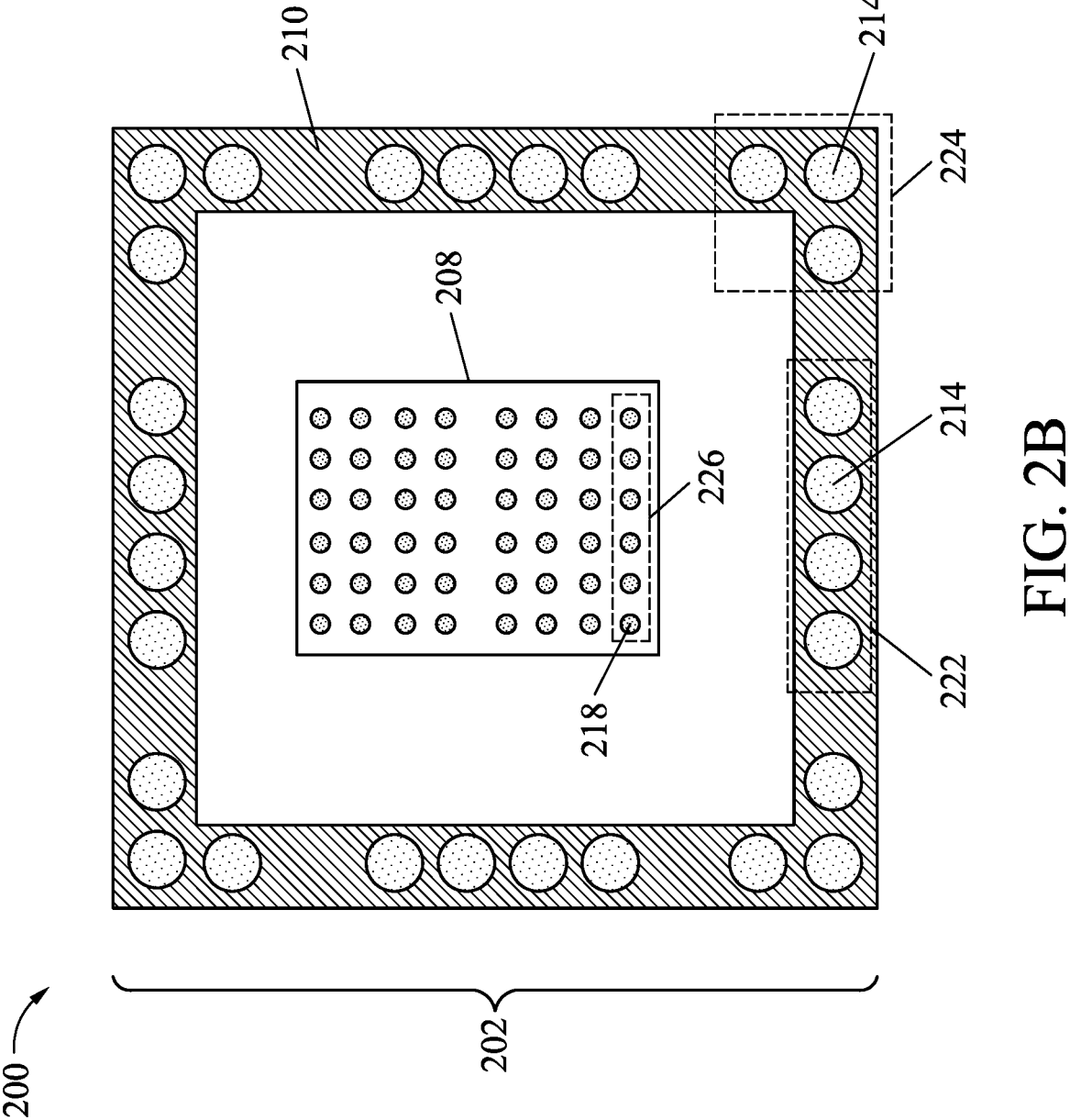
Figure 2C:
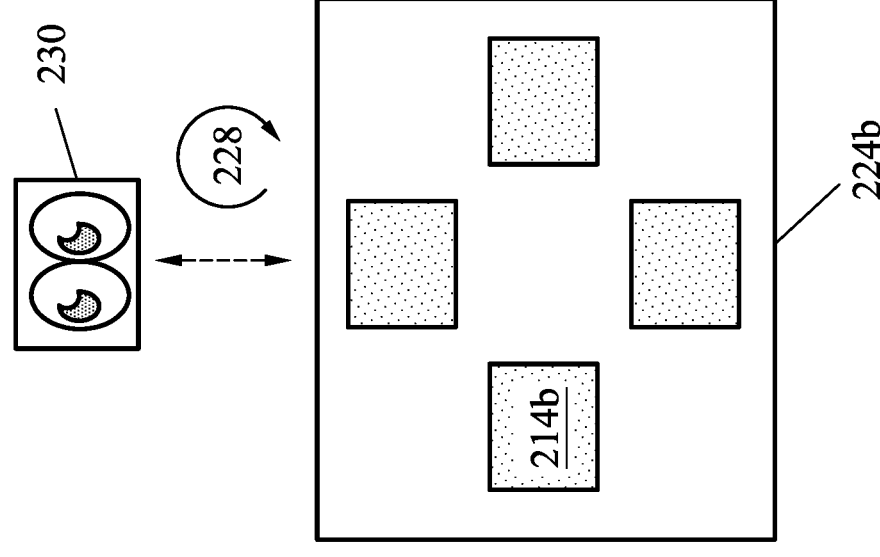
Figure 2C:
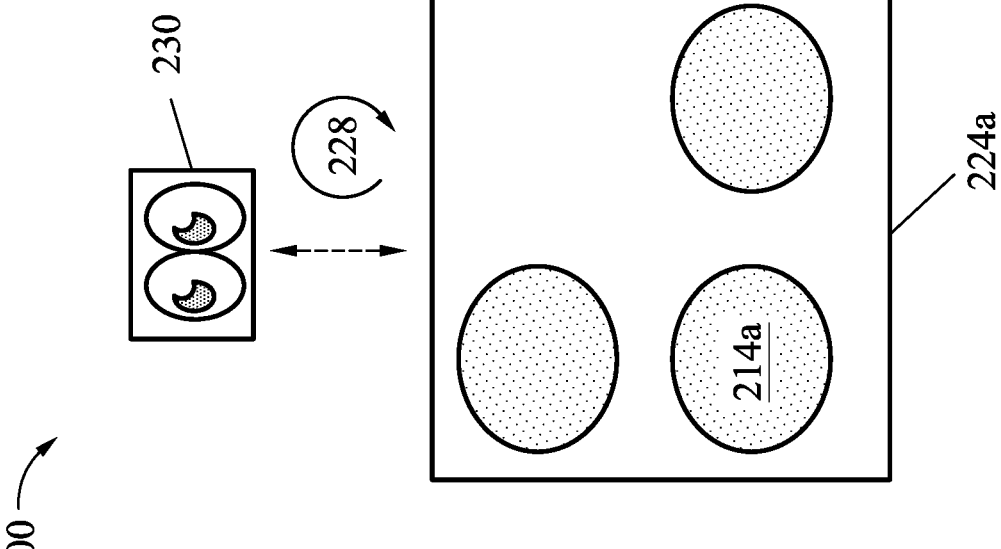

FIGS. 2A-2C are diagrams of an example device 200 including example semiconductor structures described herein. The device 200 may correspond to a 3DIC device fabricated using a Wafer-on-Wafer (WoW) fabrication process, among other examples.

As shown in the side view of FIG. 2A, the device 200 includes an IC die 202 and an IC die 204. The IC die 202 includes a substrate 206 (e.g., a silicon substrate, among other examples) and integrated circuitry 208 (e.g., a combination of logic gate structures, memory cell structures, and/or transistor structures, among other examples) above the substrate 206. The IC die 202 further includes a seal ring structure 210 near an edge of the IC die 202. The seal ring structure 210, which may be interspersed between dielectric layers of the IC die 202, provides for a physical barrier that substantially eliminates moisture and/or cracking from penetrating the IC die 202.

The IC die 202 further includes a metallization structure 212. The metallization structure 212 may route, between the dielectric layers include in the IC die 202, electrically conductive traces that connect to the integrated circuitry 208. As an example, the metallization structure 212 may include a copper (Cu) material or a tungsten (W) material, among other examples.

The IC die 202 further includes a columnar structure 214. The columnar structure 214 may be included in the substrate 206. The columnar structure 214 may be located below and/or under the seal ring structure 210. In some implementations, the columnar structure 214 corresponds to a through silicon via (TSV) structure. The columnar structure 214 may include one or more properties conducive to conducting heat 216 from the IC die 202 (e.g., heat generated by the integrated circuitry 208, among other examples) to an environment external to the device 200 for dissipation.

For example, a rate of heat transfer for the columnar structure 214 may be based at least in part on the following equation:

$$q = -kA\frac{dT}{dx}$$

In the equation, the term q represents a rate of heat transfer (e.g., a rate of conducting the heat 216 from the IC die 202 in watts (W)), the term k corresponds to a coefficient of thermal conductivity of a material included in the columnar structure 214 (e.g., in watts per meter Kelvin (W/m·K)), and the term dT/dx represents a temperature gradient across the columnar structure 214 (e.g., in Kelvin per meter (K/m)). The term A represents a cross-sectional area of the columnar structure 214, and is proportional to a cross-sectional width of the columnar structure.

For a temperature difference between ends of the columnar structure 214 (e.g., dT/dx), the rate of heat transfer (e.g., q) may be increased by increasing a cross-sectional area of the columnar structure 214 (e.g., increasing A). In some implementations, a width D1 of the columnar structure 214 (e.g., the cross-sectional width) may be included in a range of approximately 6 microns to approximately 12 microns. If the width is less than approximately 6 microns, and for a temperature difference between ends of the columnar structure 214 under a high power operating condition, a thermal conductivity of the columnar structure 214 may not be sufficient to dissipate heat to satisfy a junction temperature threshold of a diode (e.g., $T_j$ in K, among other examples) and prevent damage to the IC die 202 and/or the IC die 204. If the width D1 is greater than approximately 12 microns, the columnar structure 214 may consume excessive space within the device 200 to increase a consumption of materials (e.g., reduce a manufacturing efficiency) during fabrication of the device 200. However, other values and ranges for the width D1 are within the scope of the present disclosure.

The rate of heat transfer may be increased by forming the columnar structure 214 to include a material having an increased thermal conductivity (e.g., increasing k). In some implementations, the columnar structure 214 may include a material having a thermal conductivity that is greater than a thermal conductivity of a material included in the substrate 206. If the columnar structure 214 includes a material having a thermal conductivity that that is equal to or, or lesser than, a thermal conductivity of a material included in the substrate, a thermal conductivity of the columnar structure 214 may not be sufficient to dissipate heat to satisfy the junction temperature threshold of a diode and prevent damage to the IC die 202 and/or the IC die 204. For example, in a case where the substrate 206 includes a silicon material (e.g., approximately 148 W/m·K), the columnar structure may include a tungsten (W) material (e.g., approximately 175 W/m·K), an aluminum material (e.g., approximately 239 W/m·K), and/or a copper (Cu) material (e.g., approximately 410 W/m·K), among other examples. However, other materials that may be included in the columnar structure 214 are within the scope of the present disclosure.

In some implementations, the columnar structure 214 provides additional functionality within the device 200. For example, the columnar structure 214 be connected to, and route an electrical current from, a power source providing power to the device 200. In such a case, the columnar structure 214 may include one or more properties (e.g., an electrical capacitance, an electrical inductance, or an electrical impedance, among other examples) that are sufficient to provide the power.

The IC die 202 further includes a columnar structure 218. The columnar structure 218 may extend through one or more layers of the IC die 202 such as the substrate 206. The columnar structure 218 may extend along a portion of the seal ring structure 210. The columnar structure 218 may be adjacent to or side by side with the columnar structure 214. In some implementations, the columnar structure 218 corresponds to another through silicon via (TSV) structure. The columnar structure may include an electrically conductive material (e.g., copper (Cu), among other examples) to communicate an electrical signal 220 to or from the integrated circuitry 208 (e.g., communicate the electrical signal 220 between the integrated circuitry 208 and other integrated circuitry of the IC die 204, among other examples). To conserve space within the IC die 202 (e.g., conserve space with an advancement in a technology node, among other examples), the columnar structure 218 may include a width D2 that is lesser relative to D1. For example, the width D2 may be included in a range of approximately 1 micron to approximately 6 microns. If the width D2 is less than approximately 1 micron, a threshold related to an aspect ratio limitation of the technology node (e.g., a thickness of the substrate 206 to the width D2, among other examples) may not be satisfied. If the width D2 is greater than approximately 6 microns, the columnar structure 218 may consume excessive space within the device 200 to increase a consumption of materials (e.g., reduce a manufacturing efficiency) during fabrication of the device 200. Additionally, or alternatively and if the width D2 is greater than approximately 6 microns, an electrical performance of the columnar structure 218 (e.g., a parasitic performance related to a capacitance of the columnar structure 218, among other examples) may not satisfy a threshold to achieve a desired functionality of the device 200 during a field use of the device 200 in a computing system. However, other values and ranges for the width D2 are within the scope of the present disclosure.

In addition to communicating the electrical signal 220, the columnar structure 218 may conduct heat from the IC die 202. However, an efficiency and/or effectiveness of a thermal conduction performance of the columnar structure 218 may be lesser relative to an efficiency and/or effectiveness of a thermal conduction performance of the columnar structure 214.

In some implementation, a ratio of the width D1 to the width D2 (D1:D2) is greater than approximately 5:3. If the ratio D1:D2 is less than approximately 5:3, the columnar structure 214 may be undersized and a thermal performance (e.g., a thermal conductivity) of the columnar structure 214 not be sufficient to dissipate heat to satisfy a junction temperature threshold of a diode. Additionally, or alternatively, the columnar structure 218 may be oversized, and consume excessive space within the device 200 to increase a consumption of materials (e.g., reduce a manufacturing efficiency) during fabrication of the device 200. Additionally, or alternatively, an electrical performance of the columnar structure 218 (e.g., a parasitic performance related to a capacitance of the columnar structure 218, among other examples) may not satisfy a threshold to achieve a desired functionality of the device 200. However, other values and ranges for the ratio D1:D2 are within the scope of the present disclosure.

FIG. 2B shows an example top plan view (e.g., a footprint) of a portion of the device 200 including the columnar structure 214 and the columnar structure 218. The portion of the device 200 may correspond to the IC die 202.

As shown in FIG. 2B, the columnar structure 214 may be within a footprint (e.g., a top view footprint) of the seal ring structure 210 (e.g., below and/or under the seal ring structure 210). In some implementations, and as shown in FIG. 2B, the columnar structure 214 may be included in a row 222 (e.g., the row 222 including multiples of the columnar structure 214) that is adjacent to the integrated circuitry 208. Locating the columnar structure 214 within the footprint of the seal ring structure 210 may conserve available space of the IC die 202 to reduce an amount of materials required to manufacture the IC die (e.g., increase a manufacturing efficiency). Additionally, or alternatively, locating the columnar structure 214 within the footprint of seal ring structure 210 may enhance a transfer of heat (e.g., the heat 216) from the columnar structure 214 to the seal ring structure 210, enabling the seal ring structure 210 to spread the heat around a perimeter of the IC die 202 for transfer to another IC die (e.g., the IC die 204) and/or for dissipation to an environment surrounding the IC die 202 (e.g., an environment surround the device 200) through thermal convection.

In some implementations, the columnar structure 214 may be included in a pattern 224 (e.g., the pattern 224 including multiples of the columnar structure 214) near a corner region of the IC die 202. In some implementations, and as described in greater detail in connection with FIG. 2C and elsewhere herein, the pattern 224 may be used to align the IC die 202 during a manufacturing operation (e.g., a bonding operation that bonds the IC die 202 and the IC die 204, among other examples).

As further shown in FIG. 2B, the columnar structure 218 may be within a footprint (e.g., a top view footprint) of the integrated circuitry 208 (e.g., above the integrated circuitry 208). In some implementations, and as shown in FIG. 2B, the columnar structure 218 may be included in a row 226 (e.g., the row 226 including multiples of the columnar structure 214) that is directly above the integrated circuitry 208. Locating the columnar structure 218 within the footprint of the integrated circuitry 208 may shorten a signaling path to and from the integrated circuitry 208 to improve an electrical performance of the device 200 (e.g., reduce an electrical inductance, among other examples).

FIG. 2C shows a top view perspective of example patterns 222a and 222b that may be used as part of a backside alignment operation 228. The backside alignment operation 228 may include aligning an IC die (e.g., the IC die 202 including the substrate 206) to another die (e.g., the IC die 204) as part of a bonding operation performed by a bonding tool (e.g., the bonding tool 112 of FIG. 1, among other examples).

In the example pattern 224a, the columnar structure 214a includes an approximately round shape. In the example pattern 224b, the columnar structure 214b includes an approximately rectangular shape.

As part of the backside alignment operation 228, a vision system 230 (e.g., an image sensor or camera coupled to a microprocessor, among other examples) may detect a location of the pattern 224 (e.g., the pattern 224a or the pattern 224b) and send, to a staging component of an alignment system of the bonding tool, a signal to adjust a position (e.g., a rotational position or a linear position) of a carrier (e.g., a semiconductor wafer or a temporary carrier, among other examples) that includes the IC die. In other words, the pattern 224 may be detectable by the vision system 230.

In some implementations, and as part of the backside alignment operation 228, the pattern 224 is detected at, or through, a backside surface of a substrate of the IC die (e.g., a backside surface of the substrate 206 including the IC die 202, among other examples). The pattern 224 may be For example, the IC die may be inverted on a temporary carrier used as part of a wafer-on-wafer (WoW) silicon substrate stacking operation. In some implementations, the pattern 224 is exposed at the backside surface of the substrate as a result of a back grind operation that removes a portion of the substrate and exposes the pattern 224. In some implementations, the pattern 224 may be below the backside surface of the substrate. The backside alignment operation 228 using the pattern 224 may, relative to another alignment process using an alignment marker on a frontside surface of the IC die, demonstrate an improvement in accuracy and repeatability.

As indicated above, FIGS. 2A-2C are provided as examples. Other examples may differ from what is described with regard to FIGS. 2A-2C.

FIGS. 3A-3E are diagrams of an example series of manufacturing operations 300 form a semiconductor structure described herein. The semiconductor structure may be included as a portion of the IC die 202. In some implementations, one or more of the semiconductor processing tools 102-114 and/or the wafer/die transport tool 116 may perform one or more manufacturing operations described in connection with the series of manufacturing operations 300. In some implementations, one or more manufacturing operations described in connection with the series of manufacturing operations 300 may be performed by another semiconductor processing tool.

Figure 3A:
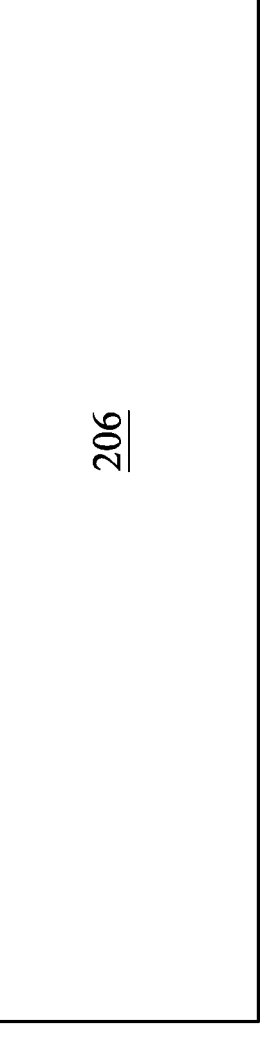
FIGS. 3A-3E, 4A-4E, and 5A-5E are diagrams of example series of manufacturing operations to form a semiconductor structure described herein.
Figure 3A:
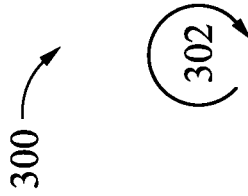

As shown in the side view of FIG. 3A, one or more of the operations 302 in the series of manufacturing operations 300 may be performed in connection with the substrate 206. The substrate 206 may include, for example, a semiconductor material such as a silicon (Si) material, among other examples. The substrate 206 may be provided in the form of a semiconductor wafer or another type of substrate.

Figure 3B:
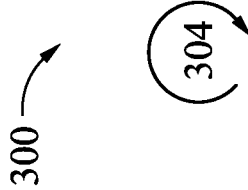
Figure 3B:
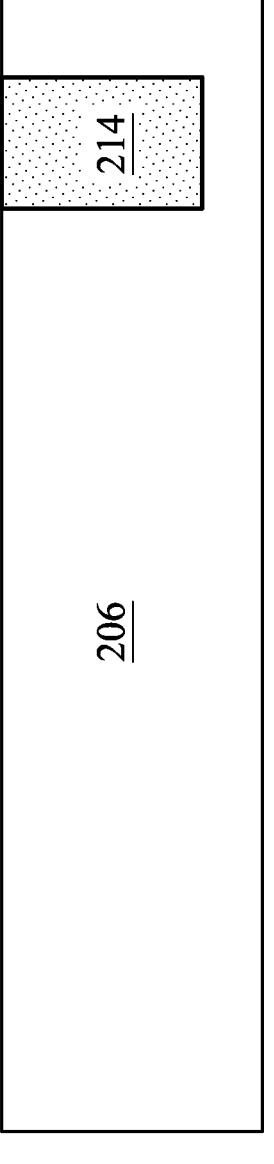

As shown in the side view of FIG. 3B, and as a part of series of operations 304, the columnar structure 214 may be formed in the substrate 206. For example, the deposition tool 102, the exposure tool 104, the develop tool 106, and/or the etch tool 108, among other examples, may perform a combination of operations to form the columnar structure 214. In FIG. 3B, a top surface of the columnar structure 214 is include in an approximate plane corresponding to a top surface of the substrate 206. In some implementations, and due in part to a size of the columnar structure 214, the tools 102-108 performing the series of operations 304 may not be associated with tools of a leading generation technology node that are included in a front end of line (FEOL), a middle end of line (MEOL), or a back end of line (BEOL) environment.

As shown in the side view of 3C, a series of operations 306 may form one or more dielectric layers 308 over the substrate 206 and the integrated circuitry 208 over the substrate 206. For example, as part of forming the one or more dielectric layers 308 over the substrate, the deposition tool 102 may deposit a dielectric layer 310 using a CVD technique, an ALD technique, a PVD technique, and/or another type of deposition technique. The dielectric layer 310 may include a silicon dioxide ($SiO_2$) material, among other examples.

Figure 3C:
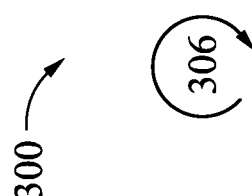
Figure 3C:
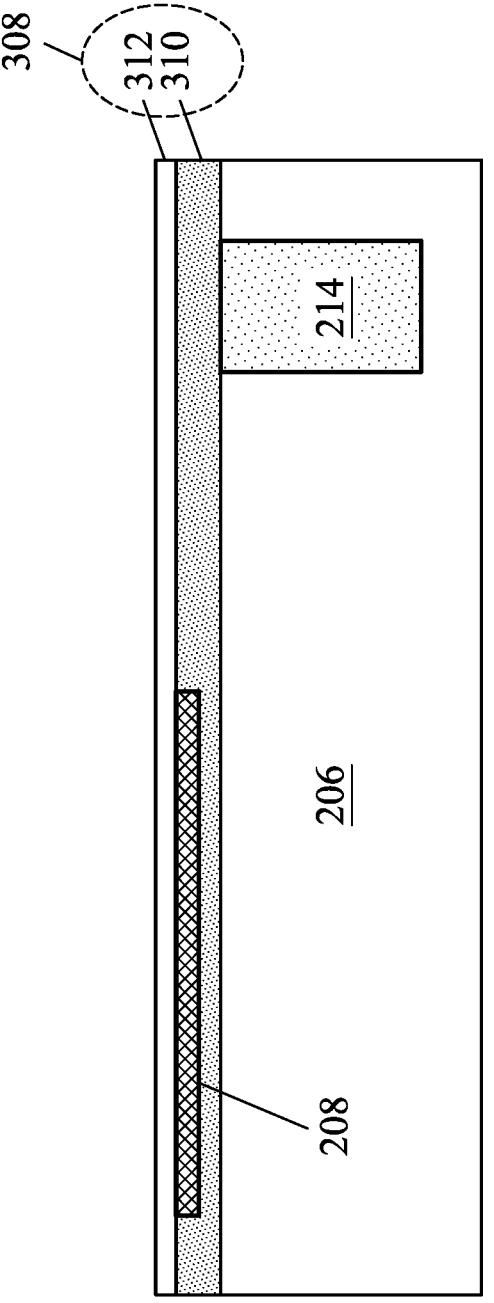
Figure 3D:
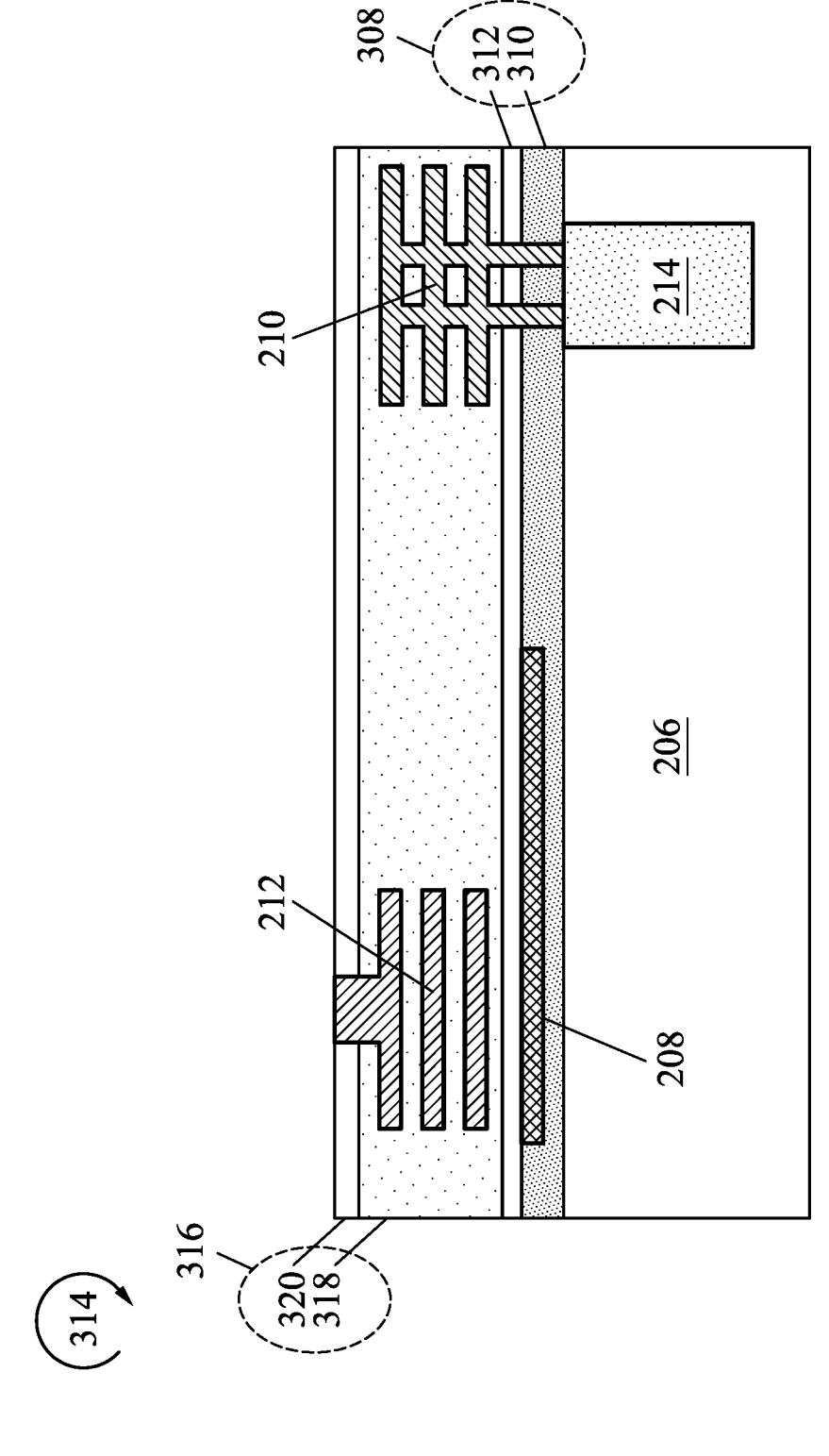

Additionally, or alternatively and as part of forming the integrated circuitry 208 over the substrate, the deposition tool 102, the exposure tool 104, the develop tool 106, and/or the etch tool 108, among other examples, may perform a combination of operations to form one or more transistors, one or more memory cells, one or more logic gates, and/or one or more circuits of another type. In FIG. 3C, the integrated circuitry 208 is formed subsequent to formation of the columnar structure 214 (e.g., the columnar structure 214 is formed prior to the integrated circuitry 208 as described in connection with FIG. 3B).

Additionally, or alternatively and as part of forming the one or more dielectric layers 308, the deposition tool 102 may deposit a dielectric layer 312 using a CVD technique, an ALD technique, a PVD technique, and/or another type of deposition technique. The dielectric layer 312 may include a silicon nitride (SiN) material, among other examples.

As shown in the side view of 3D, a series of operations 314 may form one or more dielectric layers 316, the seal ring structure 210, and the metallization structure 212 over the substrate 206. For example, as part of forming the one or more dielectric layers 316 over the substrate, the deposition tool 102 may deposit a combination of dielectric layers 318 using a CVD technique, an ALD technique, a PVD technique, and/or another type of deposition technique. The combination of dielectric layers 318 may include a silicon dioxide ($SiO_2$) material, among other examples.

Additionally, or alternatively and as part of forming the seal ring structure 210 and the metallization structure 212 over the substrate 206, the deposition tool 102, the exposure tool 104, the develop tool 106, and/or the etch tool 108, among other examples, may perform a combination of operations that forms the seal ring structure 210 and the metallization structure 212 to be interspersed with the one or more dielectric layers 316 (e.g., the combination of dielectric layers 318).

Additionally, or alternatively and as part of forming the one or more dielectric layers 316, the deposition tool 102 may deposit a dielectric layer 320 using a CVD technique, an ALD technique, a PVD technique, and/or another type of deposition technique. The dielectric layer 320 may include an undoped silicon glass (USG) material, among other examples.

Figure 3E:
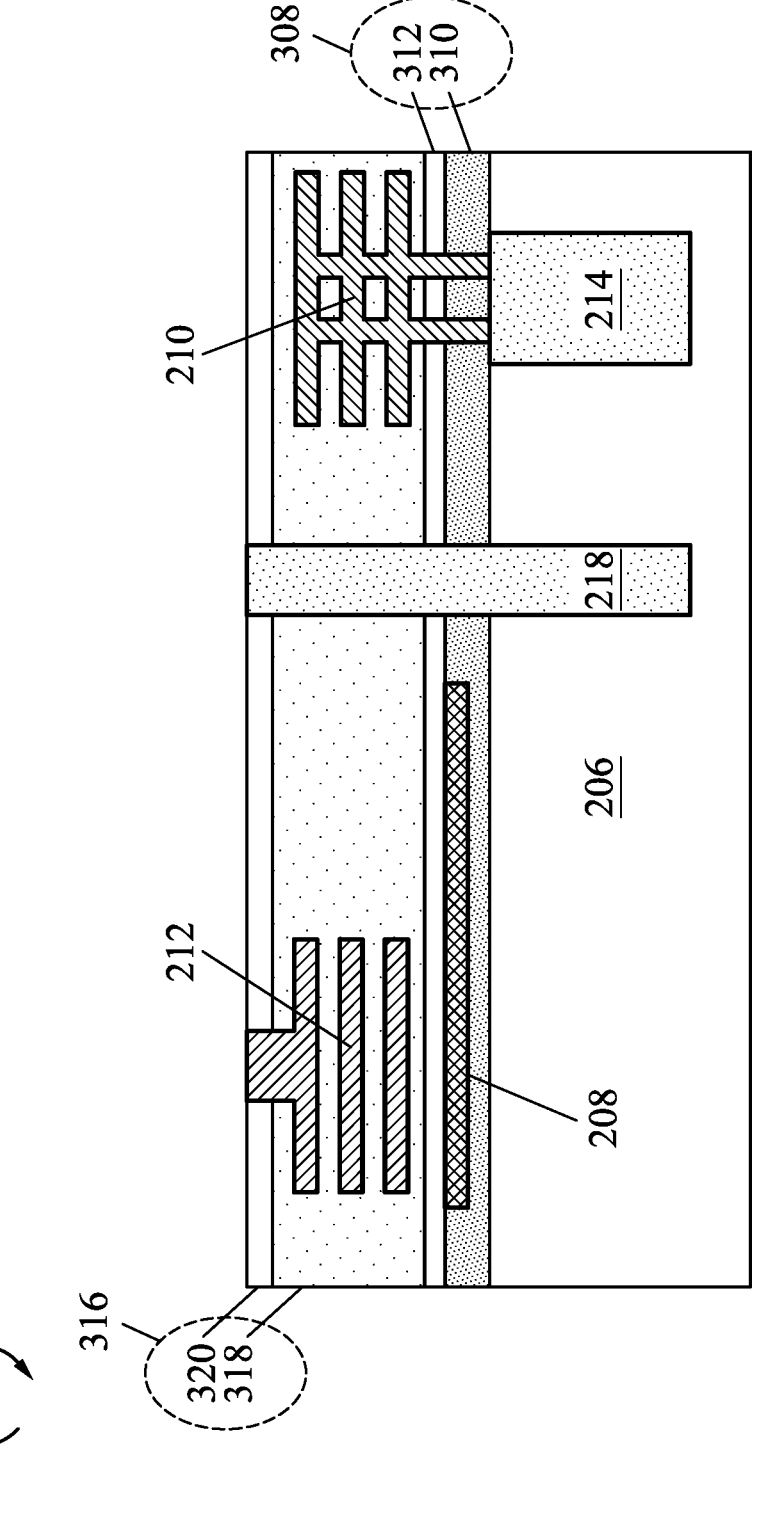

As shown in the side view of 3E, and as a part of series of operations 322, the columnar structure 218 may be formed through the one or more dielectric layers 316, through the one or more dielectric layers 308, and in the substrate 206. For example, the deposition tool 102, the exposure tool 104, the develop tool 106, and/or the etch tool 108, among other examples, may perform a combination of operations to form the columnar structure 214. In FIG. 3E, a top surface of the columnar structure 218 is included in an approximate plane corresponding to an upper surface of the one or more dielectric layers 316 (e.g., a top surface of the dielectric layer 320). In some implementations (not shown in FIG. 3E), a top surface of the columnar structure 218 is above the approximate plane corresponding to the upper surface of the one or more dielectric layers 316.

As indicated above, FIGS. 3A-3E are provided as examples. Other examples may differ from what is described with regard to FIGS. 3A-3E.

FIGS. 4A-4E are diagrams of an example series of manufacturing operations 400 form a semiconductor structure described herein. The semiconductor structure may be included as a portion of the IC die 202. In some implementations, one or more of the semiconductor processing tools 102-114 and/or the wafer/die transport tool 116 may perform one or more manufacturing operations described in connection with the series of manufacturing operations 400. In some implementations, one or more manufacturing operations described in connection with the series of manufacturing operations 400 may be performed by another semiconductor processing tool.

As shown in the side view of 4A, one or more of the operations 402 in the series of manufacturing operations 400 may be performed in connection with the substrate 206. The substrate 206 may be provided in the form of a semiconductor wafer or another type of substrate.

As shown in the side view of 4B a series of operations 404 may form the one or more dielectric layers 308 over the substrate 206 and the integrated circuitry 208 over the substrate 206. For example, as part of forming the one or more dielectric layers 308 over the substrate, the deposition tool 102 may deposit the dielectric layer 310 using a CVD technique, an ALD technique, a PVD technique, and/or another type of deposition technique.

Additionally, or alternatively and as part of forming the integrated circuitry 208 over the substrate, the deposition tool 102, the exposure tool 104, the develop tool 106, and/or the etch tool 108, among other examples, may perform a combination of operations to form one or more transistors, one or more memory cells, one or more logic gates, and/or one or more circuits of another type.

Additionally, or alternatively and as part of forming the one or more dielectric layers 308, the deposition tool 102 may deposit the dielectric layer 312 using a CVD technique, an ALD technique, a PVD technique, and/or another type of deposition technique.

Figure 4A:
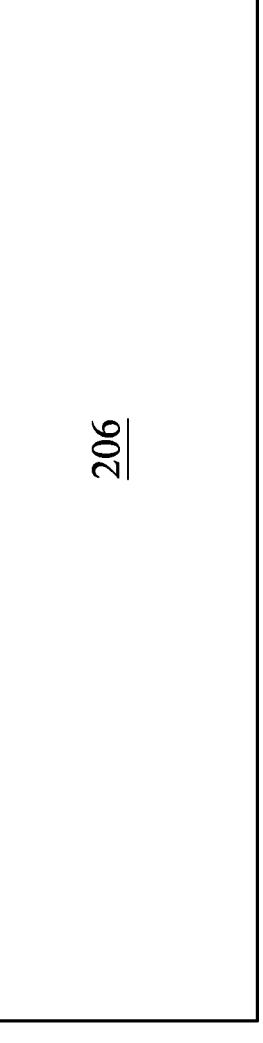
Figure 4A:
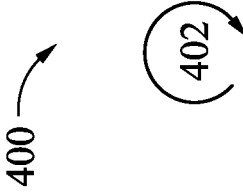
Figure 4B:
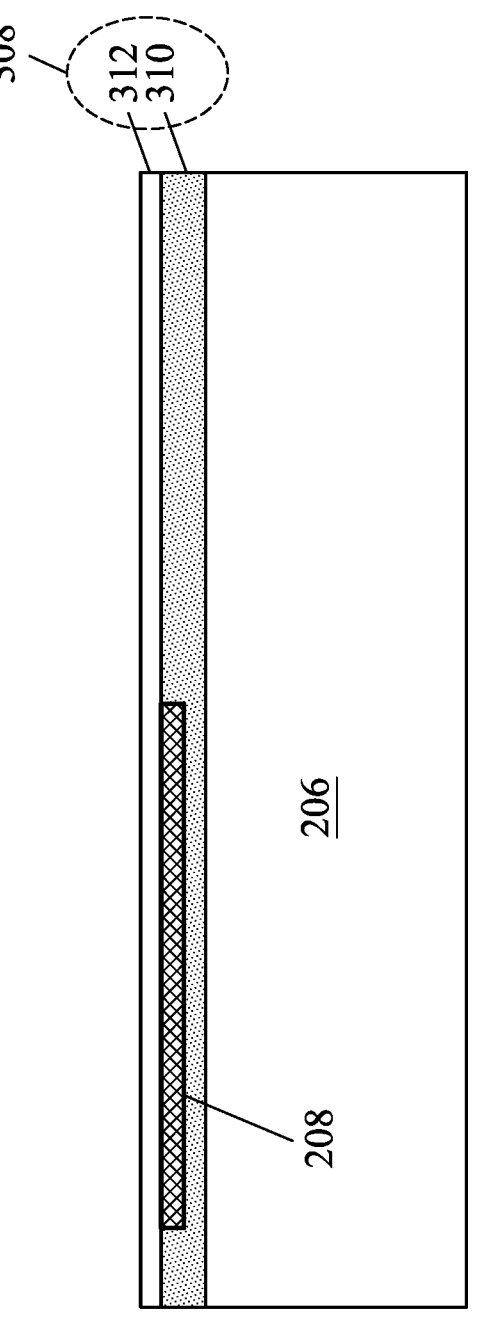
Figure 4B:
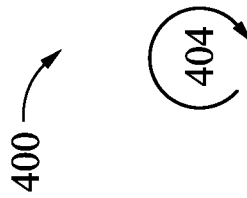
Figure 4C:
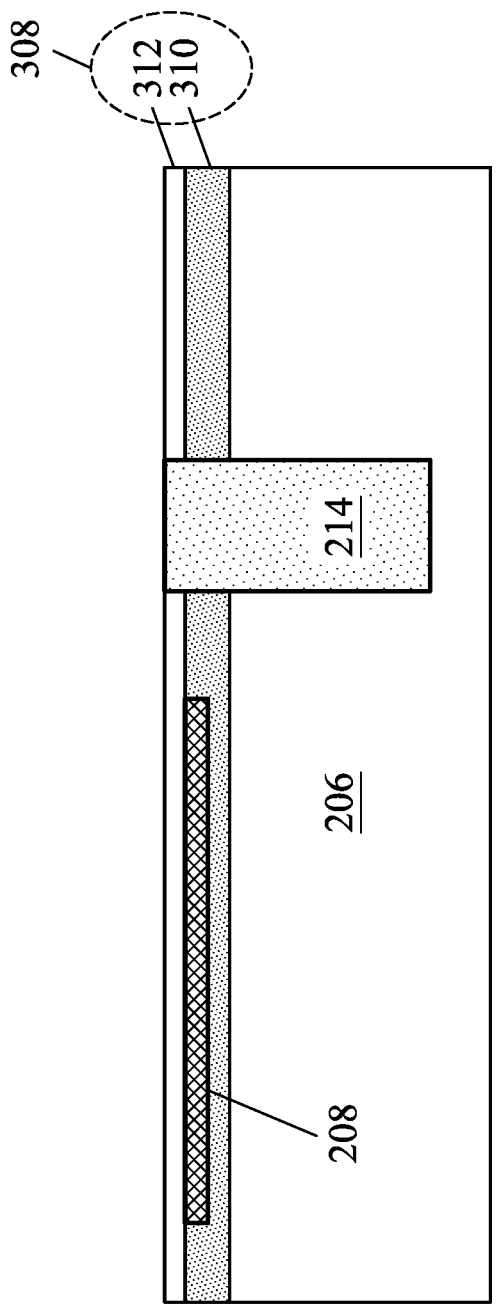
Figure 4C:
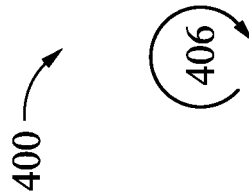
Figure 4D:
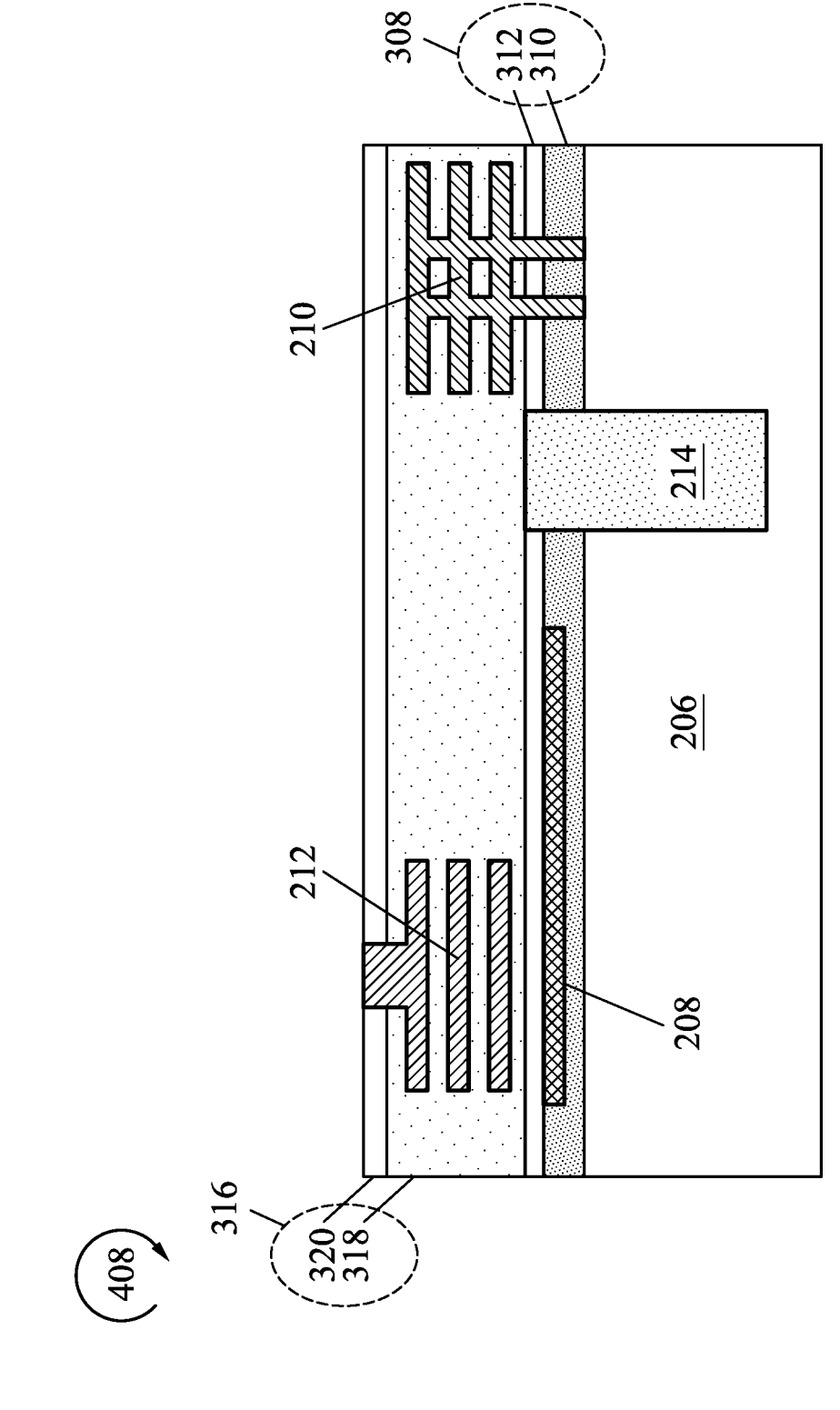

As shown in the side view of 4C, and as a part of series of operations 406, the columnar structure 214 may be formed through the one or more dielectric layers 308 and in the substrate 206. For example, the deposition tool 102, the exposure tool 104, the develop tool 106, and/or the etch tool 108, among other examples, may perform a combination of operations to form the columnar structure 214. In FIG. 4C, the top surface of the columnar structure 214 is include in an approximate plane corresponding to an upper surface of the one or more dielectric layers 308 (e.g., a top surface of the dielectric layer 312).

In FIG. 4C, the columnar structure 214 is formed subsequent to formation of the integrated circuitry (e.g., the integrated circuitry 208 is formed prior to the columnar structure 214 as described in connection with FIG. 4B). In some implementations, and due to being formed subsequent to the formation of the integrated circuitry 208, the tools 102-108 performing the series of operations 406 may be associated with a leading generation technology node included in a FEOL manufacturing environment. However, the tools 102-108 performing the series of operations 406 may not be included in a MEOL manufacturing environment and/or a BEOL manufacturing environment.

As shown in the side view of 4D, a series of operations 408 may form the one or more dielectric layers 316, the seal ring structure 210, and the metallization structure 212 over the substrate 206. For example, as part of forming the one or more dielectric layers 316 over the substrate, the deposition tool 102 may deposit a combination of dielectric layers 318 using a CVD technique, an ALD technique, a PVD technique, and/or another type of deposition technique. In this implementation, the conductive structure 214 is adjacent to and/or side by side with the seal ring structure 210, as opposed to being located under the seal ring structure 210. Thus, the conductive structure 214 is laterally adjacent to and not within a footprint (e.g., a top view footprint) of the seal ring structure 210.

Additionally, or alternatively and as part of forming the seal ring structure 210 and the metallization structure 212 over the substrate 206, the deposition tool 102, the exposure tool 104, the develop tool 106, and/or the etch tool 108, among other examples, may perform a combination of operations that forms the seal ring structure 210 and the metallization structure 212 to be interspersed with the one or more dielectric layers 316 (e.g., the combination of dielectric layers 318).

Additionally, or alternatively and as part of forming the one or more dielectric layers 316, the deposition tool 102 may deposit the dielectric layer 320 using a CVD technique, an ALD technique, a PVD technique, and/or another type of deposition technique.

Figure 4E:
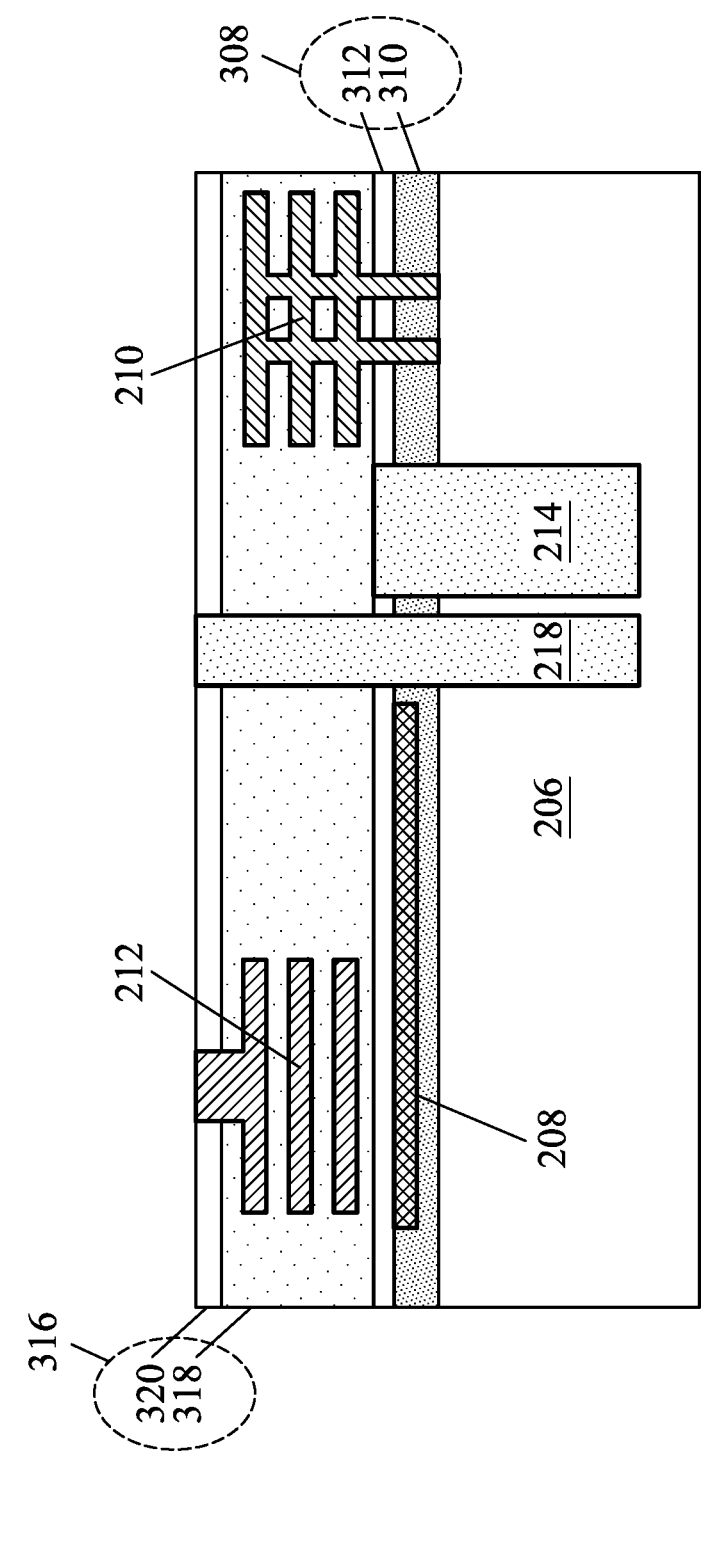

As shown in the side view of 4E, and as a part of series of operations 410, the columnar structure 218 may be formed through the one or more dielectric layers 316, through the one or more dielectric layers 308, and in the substrate 206. For example, the deposition tool 102, the exposure tool 104, the develop tool 106, and/or the etch tool 108, among other examples, may perform a combination of operations to form the columnar structure 218. In FIG. 4E, the top surface of the columnar structure 218 is included in the approximate plane corresponding to the upper surface of the one or more dielectric layers 316 (e.g., the top surface of the dielectric layer 320). In some implementations (not shown in FIG. 4E), the top surface of the columnar structure 218 is above the approximate plane corresponding to the upper surface of the one or more dielectric layers 316.

As indicated above, FIGS. 4A-4E are provided as examples. Other examples may differ from what is described with regard to FIGS. 4A-4E.

FIGS. 5A-5E are diagrams of an example series of manufacturing operations 500 form a semiconductor structure described herein. The semiconductor structure may be included as a portion of the IC die 202. In some implementations, one or more of the semiconductor processing tools 102-114 and/or the wafer/die transport tool 116 may perform one or more manufacturing operations described in connection with the series of manufacturing operations 500. In some implementations, one or more manufacturing operations described in connection with the series of manufacturing operations 500 may be performed by another semiconductor processing tool.

As shown in the side view of 5A, one or more of the operations 502 in the series of manufacturing operations 500 may be performed in connection with the substrate 206. The substrate 206 may be provided in the form of a semiconductor wafer or another type of substrate.

As shown in the side view of 5B a series of operations 504 may form the one or more dielectric layers 308 over the substrate 206 and the integrated circuitry 208 over the substrate 206. For example, as part of forming the one or more dielectric layers 308 over the substrate, the deposition tool 102 may deposit the dielectric layer 310 using a CVD technique, an ALD technique, a PVD technique, and/or another type of deposition technique.

Additionally, or alternatively and as part of forming the integrated circuitry 208 over the substrate, the deposition tool 102, the exposure tool 104, the develop tool 106, and/or the etch tool 108, among other examples, may perform a combination of operations to form one or more transistors, one or more memory cells, one or more logic gates, and/or one or more circuits of another type.

Additionally, or alternatively and as part of forming the one or more dielectric layers 308, the deposition tool 102 may deposit the dielectric layer 312 using a CVD technique, an ALD technique, a PVD technique, and/or another type of deposition technique.

As shown in the side view of 5C, a series of operations 506 may form the one or more dielectric layers 316, the seal ring structure 210, and the metallization structure 212 over the substrate 206. For example, as part of forming the one or more dielectric layers 316 over the substrate, the deposition tool 102 may deposit a combination of dielectric layers 318 using a CVD technique, an ALD technique, a PVD technique, and/or another type of deposition technique.

Additionally, or alternatively and as part of forming the seal ring structure 210 and the metallization structure 212 over the substrate 206, the deposition tool 102, the exposure tool 104, the develop tool 106, and/or the etch tool 108, among other examples, may perform a combination of operations that forms the seal ring structure 210 and the metallization structure 212 to be interspersed with the one or more dielectric layers 316 (e.g., the combination of dielectric layers 318).

Additionally, or alternatively and as part of forming the one or more dielectric layers 316, the deposition tool 102 may deposit the dielectric layer 320 using a CVD technique, an ALD technique, a PVD technique, and/or another type of deposition technique.

Figure 5A:
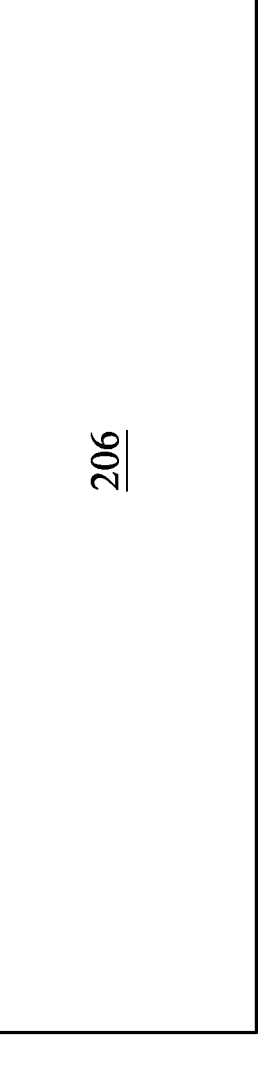
Figure 5B:
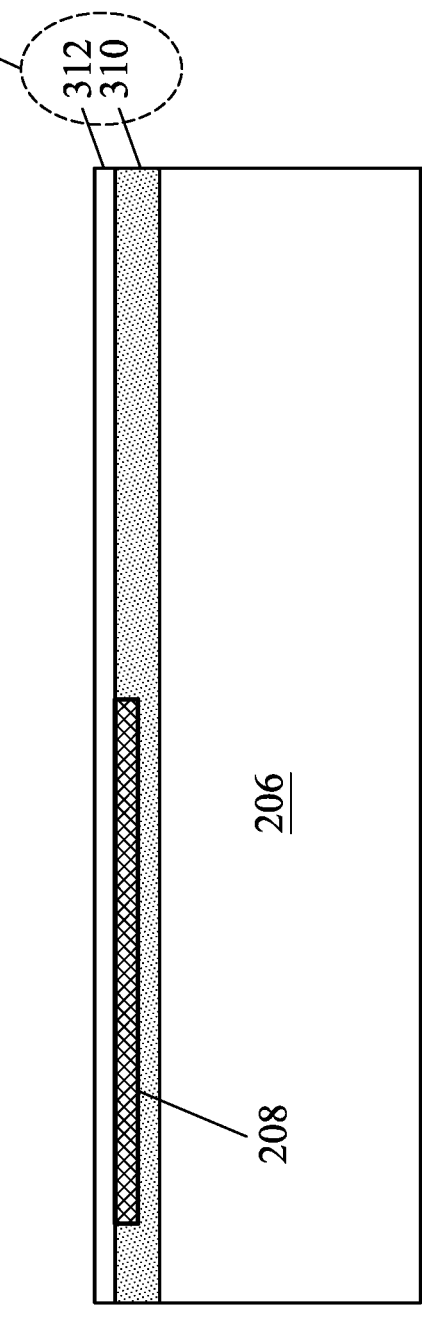
Figure 5B:
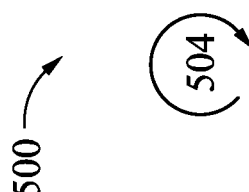
Figure 5C:
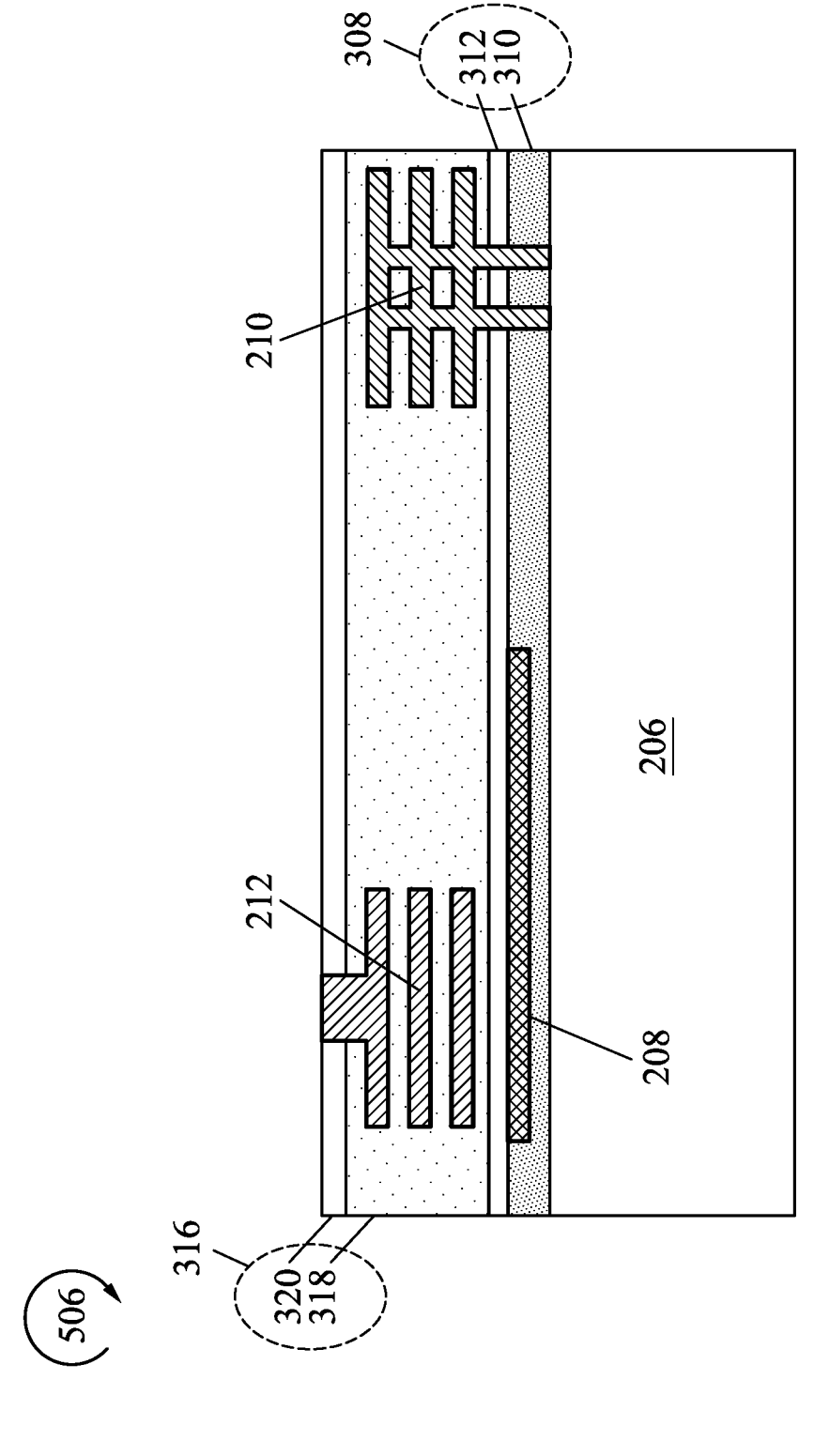
Figure 5D:
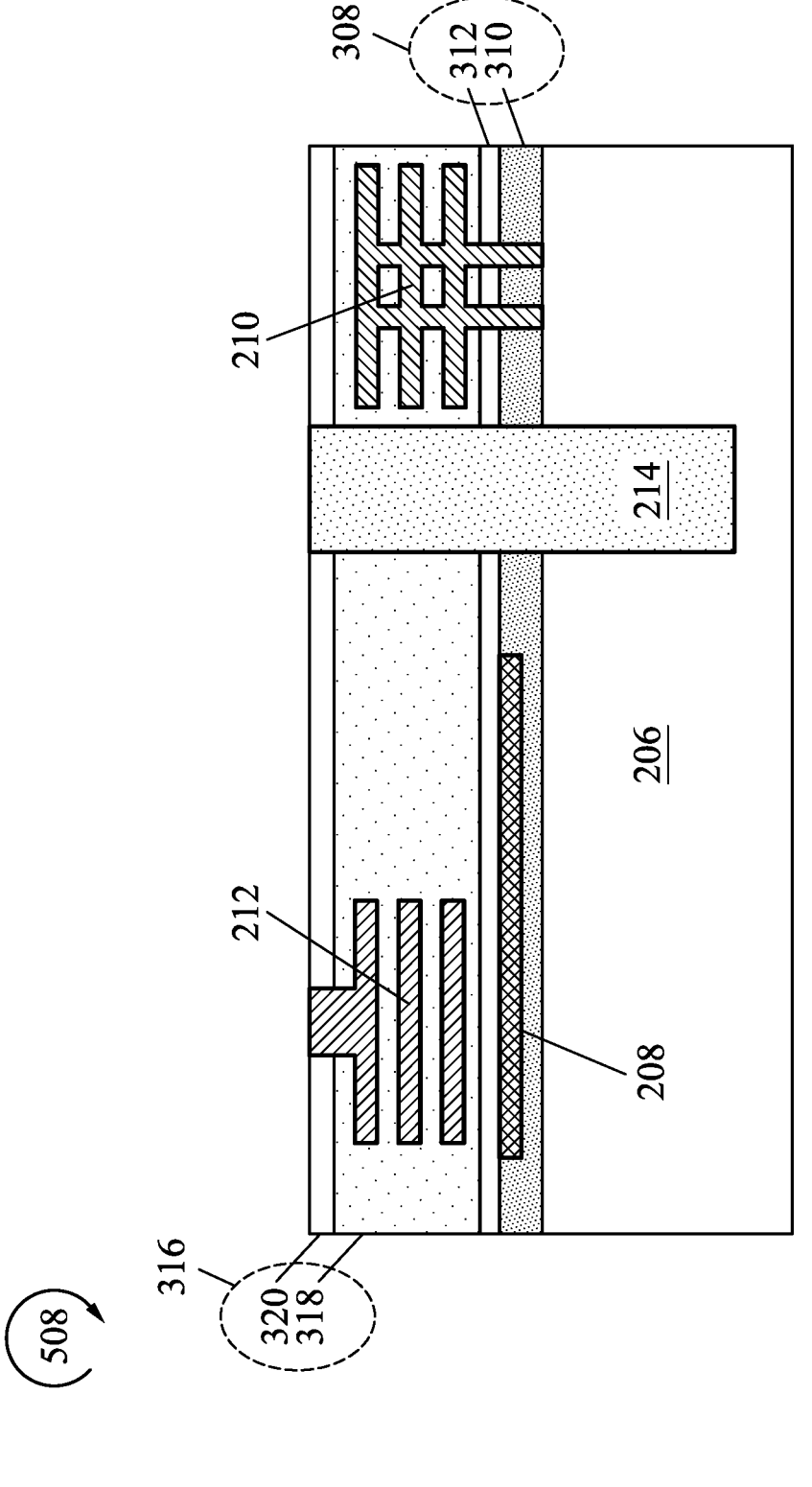

As shown in the side view of 5D, and as a part of series of operations 508, the columnar structure 214 may be formed through the one or more dielectric layers 316, through the one or more dielectric layers 308, and in the substrate 206. For example, the deposition tool 102, the exposure tool 104, the develop tool 106, and/or the etch tool 108, among other examples, may perform a combination of operations to form the columnar structure 214. In FIG. 5D, the top surface of the columnar structure 214 is included in the approximate plane corresponding to the upper surface of the one or more dielectric layers 316 (e.g., the top surface of the dielectric layer 320). In some implementations (not shown in FIG. 5D), the top surface of the columnar structure 214 is above the approximate plane corresponding to the upper surface of the one or more dielectric layers 316.

In FIG. 5D, the columnar structure 214 is formed subsequent to formation of the one or more dielectric layers 316 (e.g., the one or more dielectric layers 316 are formed prior to the columnar structure 214 as described in connection with FIG. 5C). In some implementations, and due to being formed subsequent to the formation of the one or more dielectric layers 316, the tools 102-108 performing the series of operations 508 may be associated with a leading generation technology node included in a FEOL manufacturing environment, a MEOL manufacturing environment, and/or a BEOL manufacturing environment. In this implementation, the conductive structure 214 is adjacent to and/or side by side with the seal ring structure 210, as opposed to being located under the seal ring structure 210. Thus, the conductive structure 214 is laterally adjacent to and not within a footprint (e.g., a top view footprint) of the seal ring structure 210.

Figure 5E:
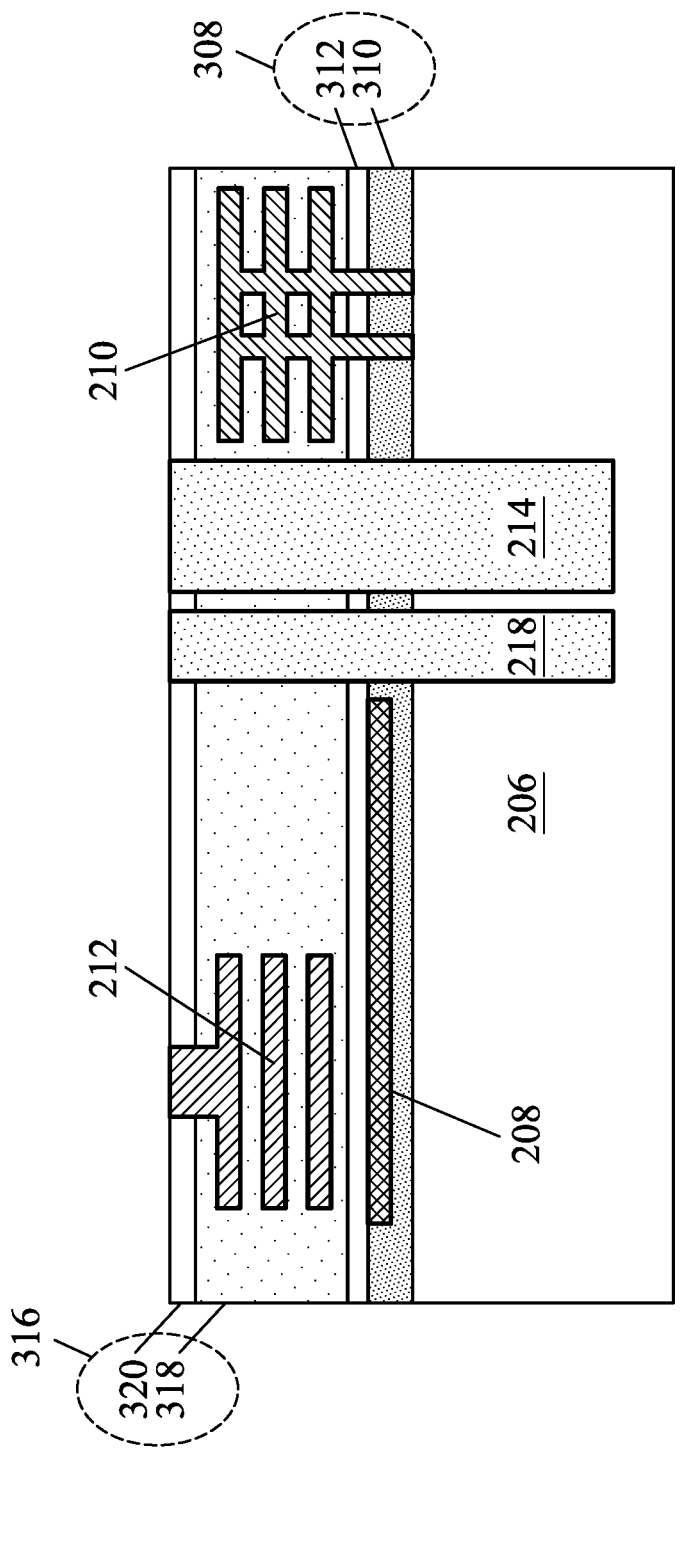

As shown in the side view of 5E, and as a part of series of operations 510, the columnar structure 218 may be formed through the one or more dielectric layers 316, through the one or more dielectric layers 308, and in the substrate 206. For example, the deposition tool 102, the exposure tool 104, the develop tool 106, and/or the etch tool 108, among other examples, may perform a combination of operations to form the columnar structure 218. In FIG. 5E, the top surface of the columnar structure 218 is included in the approximate plane corresponding to the upper surface of the one or more dielectric layers 316 (e.g., the top surface of the dielectric layer 320). In some implementations (not shown in FIG. 5E), the top surface of the columnar structure 218 is above the approximate plane corresponding to the upper surface of the one or more dielectric layers 316.

As shown in the FIGS. 5D and 5E, the columnar structures 214 and 218 are formed through separate series of operations (e.g., the columnar structure 214 is formed through the series of operations 508 and the columnar structure 218 is formed through the series of operations 510). The separate series of operations may include two photolithography and two etch cycles (e.g., "2P2E" or "LELE") to maintain aspect ratios of the columnar structures 214 and 218 (e.g., due to patterning and etch recipes, aspect ratios may not be maintained if a single photolithography and etch cycle common to both of the columnar structures 214 and 218 is used).

As indicated above, FIGS. 5A-5E are provided as examples. Other examples may differ from what is described with regard to FIGS. 5A-5E.

Figure 6A:
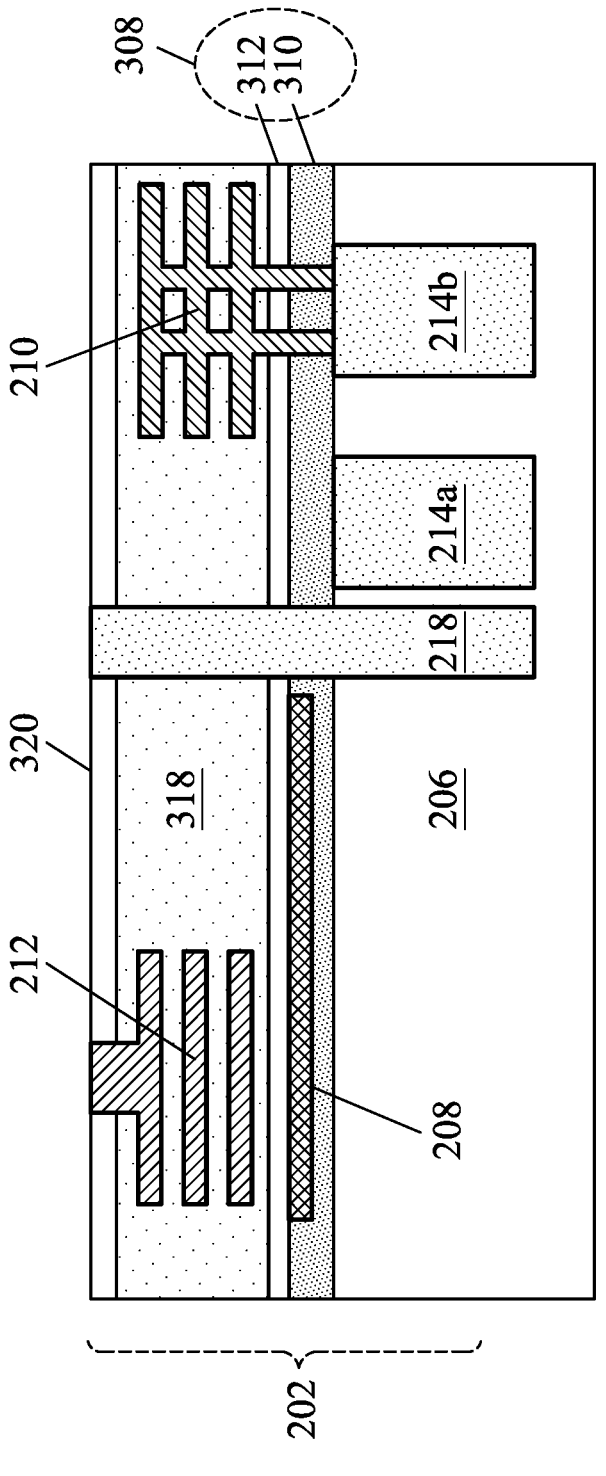
FIGS. 6A-6C are diagrams of example implementations of the semiconductor structure described herein.
Figure 6B:
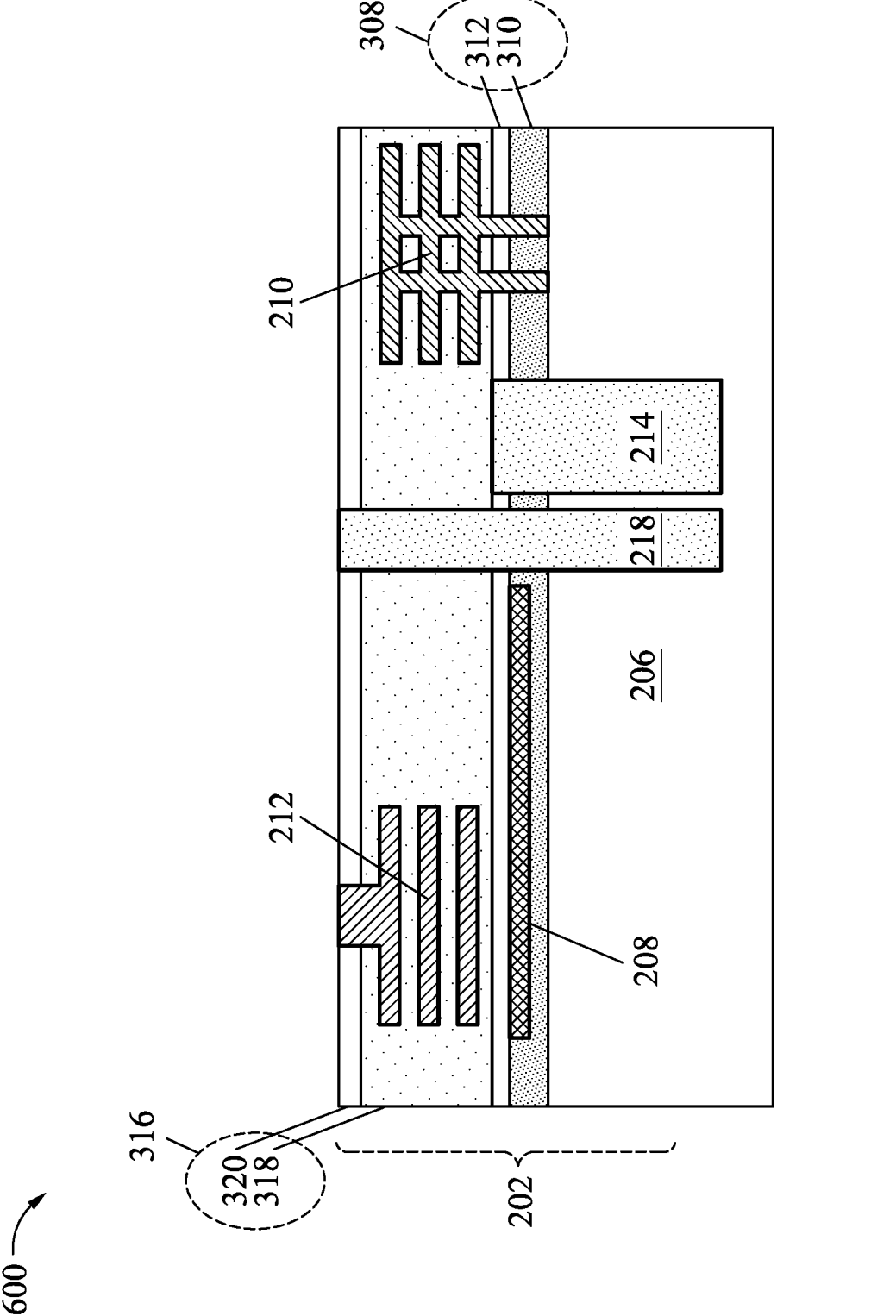
Figure 6C:
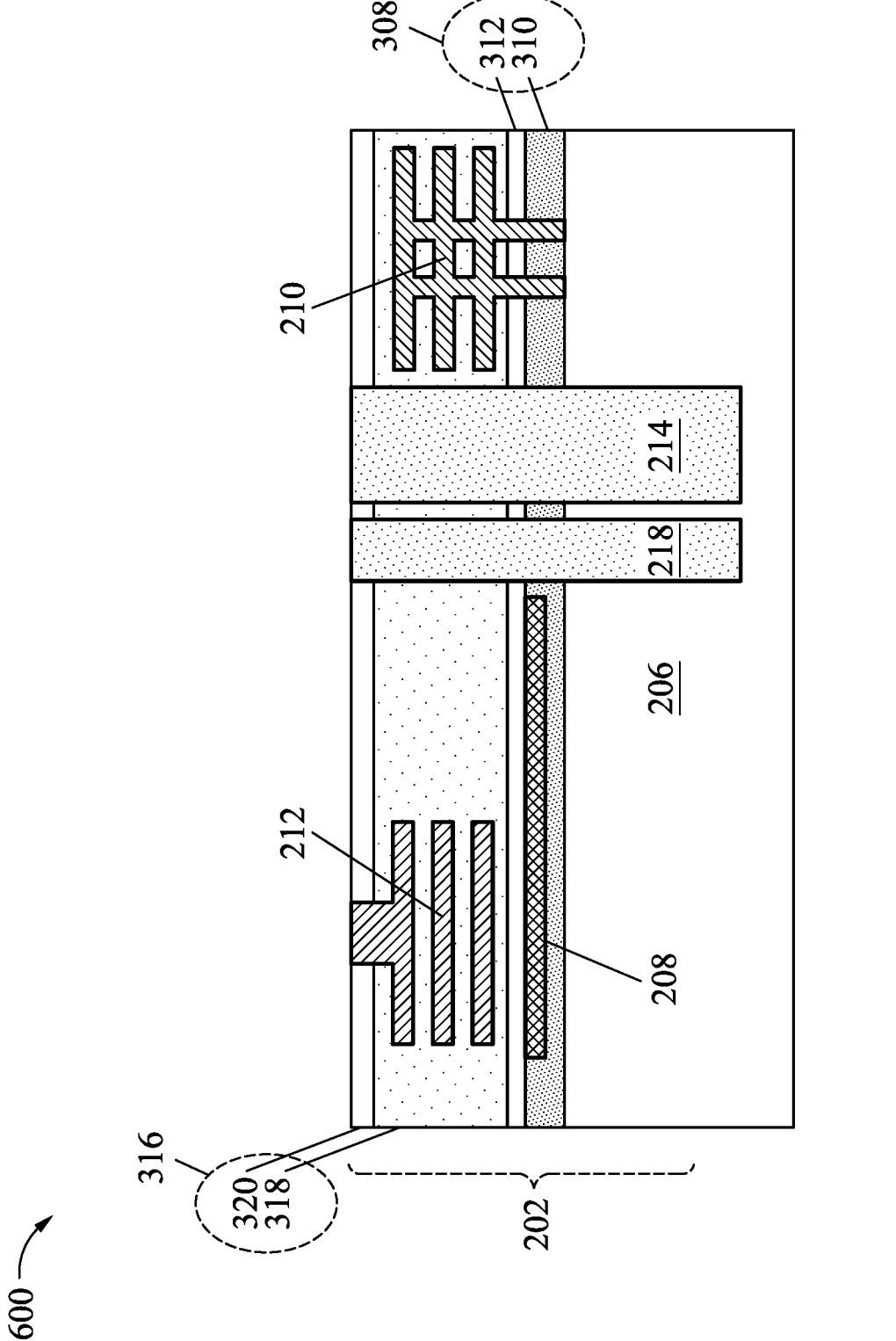

FIGS. 6A-6C are diagrams of example implementations 600 of the example semiconductor structure described herein. The implementations 600 may be included in the IC die 202. Further, the implementations 600 may be formed using techniques described in connection with FIGS. 3A-3E, 4A-4E, and/or 5A-5E.

FIG. 6A shows a side view of an example implementation of a semiconductor structure (e.g., a multi-dimension TSV structure) formed in the IC die 202 using techniques described in connection with FIGS. 3A-3E. As shown in the side view of 6A, a device (e.g., the IC die 202) includes the substrate 206. The device includes the seal ring structure above the substrate 206. The device includes a dielectric layer 320 above the seal ring structure 210 above the substrate 206. The device includes a first columnar structure (e.g., the columnar structure 214a) that penetrates into the substrate 206 adjacent to the seal ring structure 210. The first columnar structure includes a first top surface in a first approximate plane corresponding to an upper surface of the substrate 206. The device includes a second columnar structure (e.g., the columnar structure 214b) that is adjacent to a first side of the first columnar structure and that penetrates into the substrate 206 directly below the seal ring structure 210. The second columnar structure includes a second top surface in the first approximate plane. The device includes a third columnar structure (e.g., the columnar structure 218) that penetrates into the substrate 206 adjacent a second side of the first columnar structure and that is opposite the first side. The third columnar structure includes a third top surface in, or above, a third approximate plane corresponding to an upper surface of the dielectric layer 320.

In FIG. 6A, the third columnar structure (e.g., the columnar structure 218) is between the first columnar structure (e.g., the columnar structure 214a) and the metallization structure 212. Additionally, or alternatively, the third columnar structure is between the first columnar structure and the integrated circuitry 208.

The implementation 600 of FIG. 6A affords a large quantity of the columnar structure 214 to populate the IC die 202 (e.g., the columnar structures 214a in available space of the substrate 206 and the columnar structure 214b below the seal ring structure 210). The large quantity of the columnar structure 214 may be advantageous for thermal control purposes (e.g., rates of thermal conductivity associated with the columnar structures 214a and 214b are greater relative to a rate of thermal conductivity associated with the columnar structure 218). Additionally, or alternatively and as described in connection with FIGS. 3B, the implementation 600 of FIG. 6A may not utilize tools associated with a leading generation technology node and that are included in an FEOL manufacturing environment, an MEOL manufacturing environment, or a BEOL manufacturing environment. Such tools may be repurposed for operations more suited to use of the leading generation technology node (e.g., forming the integrated circuitry 208, forming contact structures, or forming interconnect structures, among other examples).

FIG. 6B shows a side view of an example implementation of a semiconductor structure (e.g., a multi-dimension TSV structure) formed in the IC die 202 using techniques described in connection with FIGS. 4A-4E. As shown in FIG. 6B, a device (e.g., the IC die 202) includes the substrate 206. The device includes the seal ring structure above the substrate 206. The device includes one or more first dielectric layers (e.g., the one or more dielectric layers 308) above the substrate 206. The device includes one or more second dielectric layers (e.g., the combination of dielectric layers 318) above the one or more first dielectric layers. The device includes the seal ring structure 210 interspersed with the one or more second dielectric layers. The device includes one or more third dielectric layers (e.g., the dielectric layer 320) above the one or more second dielectric layers. The device includes a first columnar structure (e.g., the columnar structure 214) penetrating into the substrate 206 adjacent to the seal ring structure 210. The first columnar structure includes a first side adjacent to the seal ring structure and a first top surface above a first approximate plane, where the first approximate plane corresponds to an upper surface of the substrate 206. The first columnar structure includes a first set of properties (e.g., the width D1 and a material having a thermal conductivity as described in connection with FIG. 2A) related to a first rate of thermal conduction for a temperature difference. The device includes a second columnar structure (e.g., the columnar structure 218) penetrating into the substrate 206 adjacent a second side of the first columnar structure that is opposite the first side. The second columnar structure includes a second top surface in, or above, a second approximate plane, where the second approximate plane corresponds to an upper surface of the one or more third dielectric layers (e.g., a top surface of the dielectric layer 320). The columnar structure includes a second set of properties (e.g., the width D2 and a material having a thermal conductivity as described in connection with FIG. 2A) related to a second rate of thermal conduction for the temperature difference, where the second rate of thermal conduction is lesser relative to the first rate of thermal conduction.

As shown in FIG. 6B, the first top surface (e.g., the top surface of the columnar structure 214) may be in a third approximate plane corresponding to the upper surface of the one or more first dielectric layers (e.g., a top surface of the dielectric layer 312). As described in connection with as described in connection with FIG. 4C, the implementation 600 of FIG. 6B may not utilize tools associated with a leading generation technology node and that are included in a MEOL manufacturing environment or a BEOL manufacturing environment. Such tools may be repurposed for operations more suited to use of the leading generation technology node (e.g., forming contact structures or forming interconnect structures, among other examples).

FIG. 6C shows a side view of an example implementation of a semiconductor structure (e.g., a multi-dimension TSV structure) formed in the IC die 202 using techniques described in connection with FIGS. 5A-5E. As shown in FIG. 6C, a device (e.g., the IC die 202) includes the substrate 206. The device includes the seal ring structure above the substrate 206. The device includes one or more first dielectric layers (e.g., the one or more dielectric layers 308) above the substrate 206. The device includes one or more second dielectric layers (e.g., the combination of dielectric layers 318) above the one or more first dielectric layers. The device includes the seal ring structure 210 interspersed with the one or more second dielectric layers. The device includes one or more third dielectric layers (e.g., the dielectric layer 320) above the one or more second dielectric layers. The device includes a first columnar structure (e.g., the columnar structure 214) penetrating into the substrate 206 adjacent to the seal ring structure 210. The first columnar structure includes a first side adjacent to the seal ring structure and a first top surface above a first approximate plane, where the first approximate plane corresponds to an upper surface of the substrate 206. The first columnar structure includes a first set of properties (e.g., the width D1 and a material having a thermal conductivity as described in connection with FIG. 2A) related to a first rate of thermal conduction for a temperature difference. The device includes a second columnar structure (e.g., the columnar structure 218) penetrating into the substrate 206 adjacent a second side of the first columnar structure that is opposite the first side. The second columnar structure includes a second top surface in, or above, a second approximate plane, where the second approximate plane corresponds to an upper surface of the one or more third dielectric layers (e.g., a top surface of the dielectric layer 320). The columnar structure includes a second set of properties (e.g., the width D2 and a material having a thermal conductivity as described in connection with FIG. 2A) related to a second rate of thermal conduction for the temperature difference, where the second rate of thermal conduction is lesser relative to the first rate of thermal conduction.

As shown in FIG. 6C, the first top surface (e.g., the top surface of the columnar structure 214) may be in a third approximate plane corresponding to the upper surface of the one or more third dielectric layers (e.g., a top surface of the dielectric layer 320). As described in connection with FIG. 4C, the implementation 600 of FIG. 6C may not utilize tools associated with a leading generation technology node and that are included in a BEOL manufacturing environment. Such tools may be repurposed for operations more suited to use of the leading generation technology node (e.g., forming interconnect structures, among other examples).

As indicated above, FIGS. 6A-6C are provided as examples. Other examples may differ from what is described with regard to FIGS. 6A-6C.

FIGS. 7A-7D are diagrams of an example series of manufacturing operations 700 used to incorporate the example semiconductor structure into an example device described herein. In some implementations, one or more of the semiconductor processing tools 102-114 and/or the wafer/die transport tool 116 may perform one or more manufacturing operations described in connection with the series of manufacturing operations 700. In some implementations, one or more of the series of manufacturing operations 700 are performed by another semiconductor processing tool.

Figure 7A:
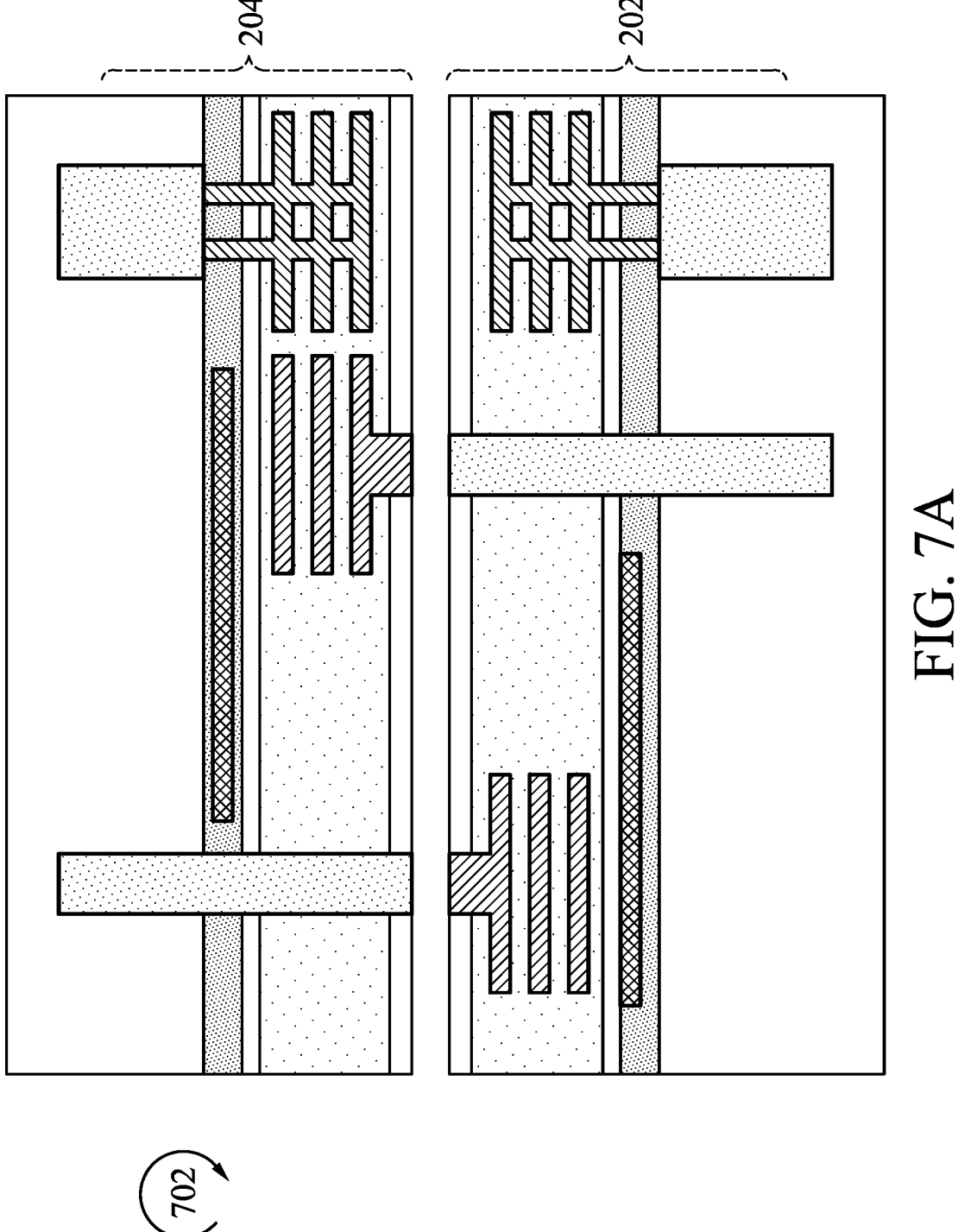
FIGS. 7A-7D are diagrams of an example series of manufacturing operations used to incorporate the semiconductor structure into the device described herein.

As shown in the side view of FIG. 7A, one or more operations 702 of the series of manufacturing operations 700 may be performed in connection with the IC die 202 and/or the IC die 204 (e.g., substrates including IC dies including multi-dimensional TSV structures). Portions of the one series of manufacturing operations 700 may correspond to portions of a Wafer-on-Wafer (WoW) manufacturing operation, an IC die stacking operations, or an IC die packaging operation, among other examples.

Figure 7B:
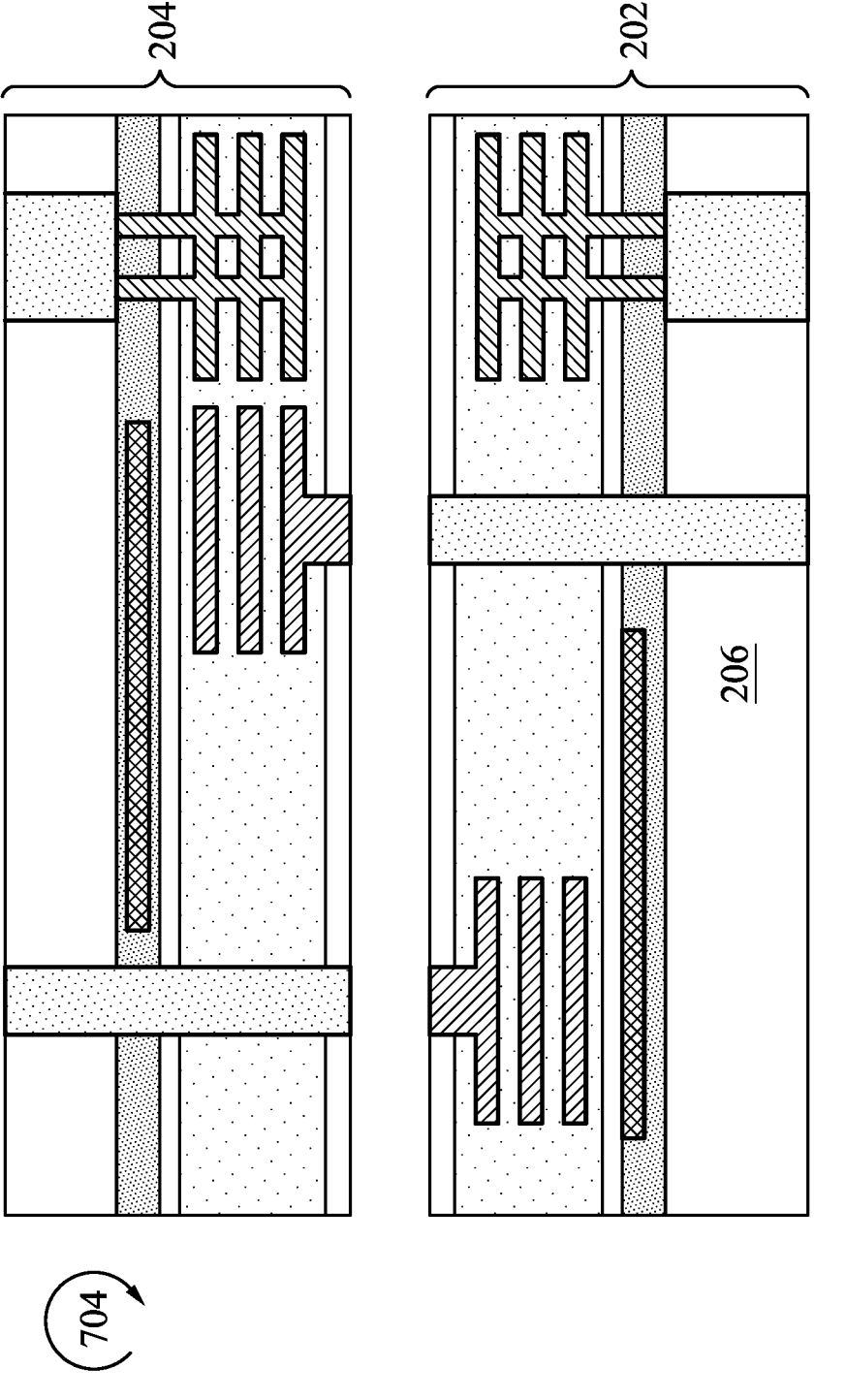

As shown in the side view of FIG. 7B, a thinning operation 704 may reduce a thickness of a substrate including the IC die 202 (e.g., the substrate 206). Additionally, or alternatively, another thinning operation may reduce a thickness of a substrate including the IC die 204. In some implementations, the IC die 202 (e.g., the substrate) is inverted on a temporary carrier.

As an example, and as part of the thinning operation 704, the planarization tool 110 of FIG. 1 may planarize the substrate using a polishing or planarizing technique such as chemical mechanical polishing/planarization (CMP). A CMP process may include depositing a slurry (or polishing compound) onto a polishing pad. The substrate 206 may be rotated as the substrate 206 pressed against the polishing pad. The slurry and polishing pad act as an abrasive that polishes or planarizes (e.g., thins) the substrate 206 as the substrate 206 is rotated. The polishing pad may also be rotated to ensure a continuous supply of slurry is applied to the polishing pad. The thinning operation 704 may expose the columnar structure 214 and/or the columnar structure 218.

Figure 7C:
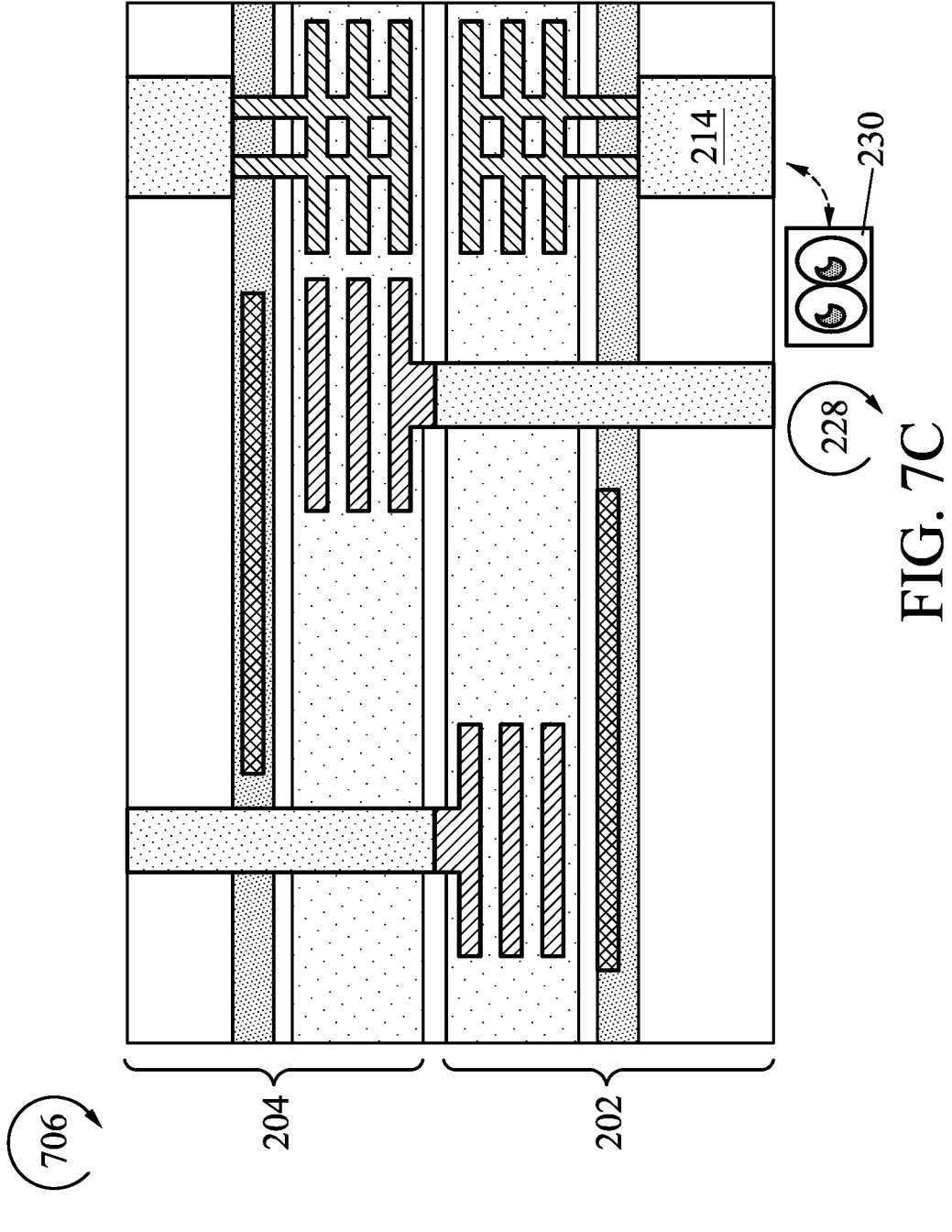

As shown in the side view of FIG. 7C, bonding operation 706 may bond (e.g., join) the IC die 202 and the IC die 204. For example, the bonding tool 112 of FIG. 1 may bond the IC die 202 and the IC die 204 (e.g., respective substrates or wafers including the IC dies 202 and 204, among other examples) using a hybrid bonding operation, a eutectic bonding operation, a direct bonding operation, and/or another type of bonding operation.

As part of the bonding operation 706, a backside alignment operation (e.g., the backside alignment operation 228 as described in connection with FIG. 2C) may align the IC die 202 and the IC die 204. Such a backside alignment operation may detect a pattern including the columnar structure 214, among other examples. Further, the backside alignment operation may correspond to a direct alignment technique.

Figure 7D:
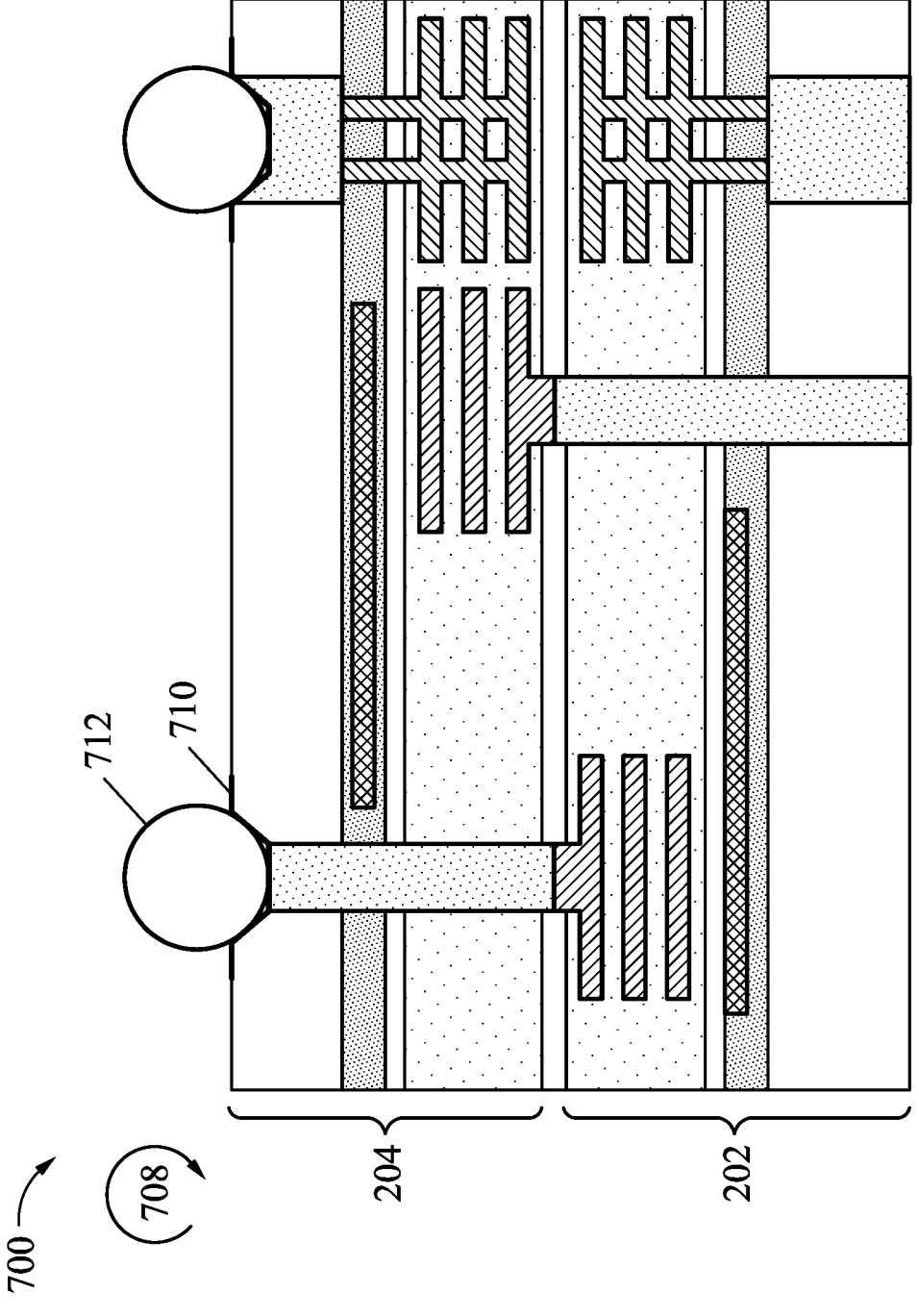

As shown in the side view of FIG. 7D, a series of operations 708 may form connection structures on the IC die 204. The series of operations 708 may include, for example, the connection tool 114 of FIG. 1 forming underbump metallization (UBM) structures 710 and solderballs 712 on columnar structures of the IC die 204. The UBM structures 710 and/or the solderballs 712 may include materials such as a gold (Au) material, a copper (Cu) material, a silver (Ag) material, a nickel (Ni) material, a tin (Sn) material, or a palladium (Pd) material, among other examples.

As indicated above, FIGS. 7A-7D are provided as examples. Other examples may differ from what is described with regard to FIGS. 7A-7D.

Figure 8:
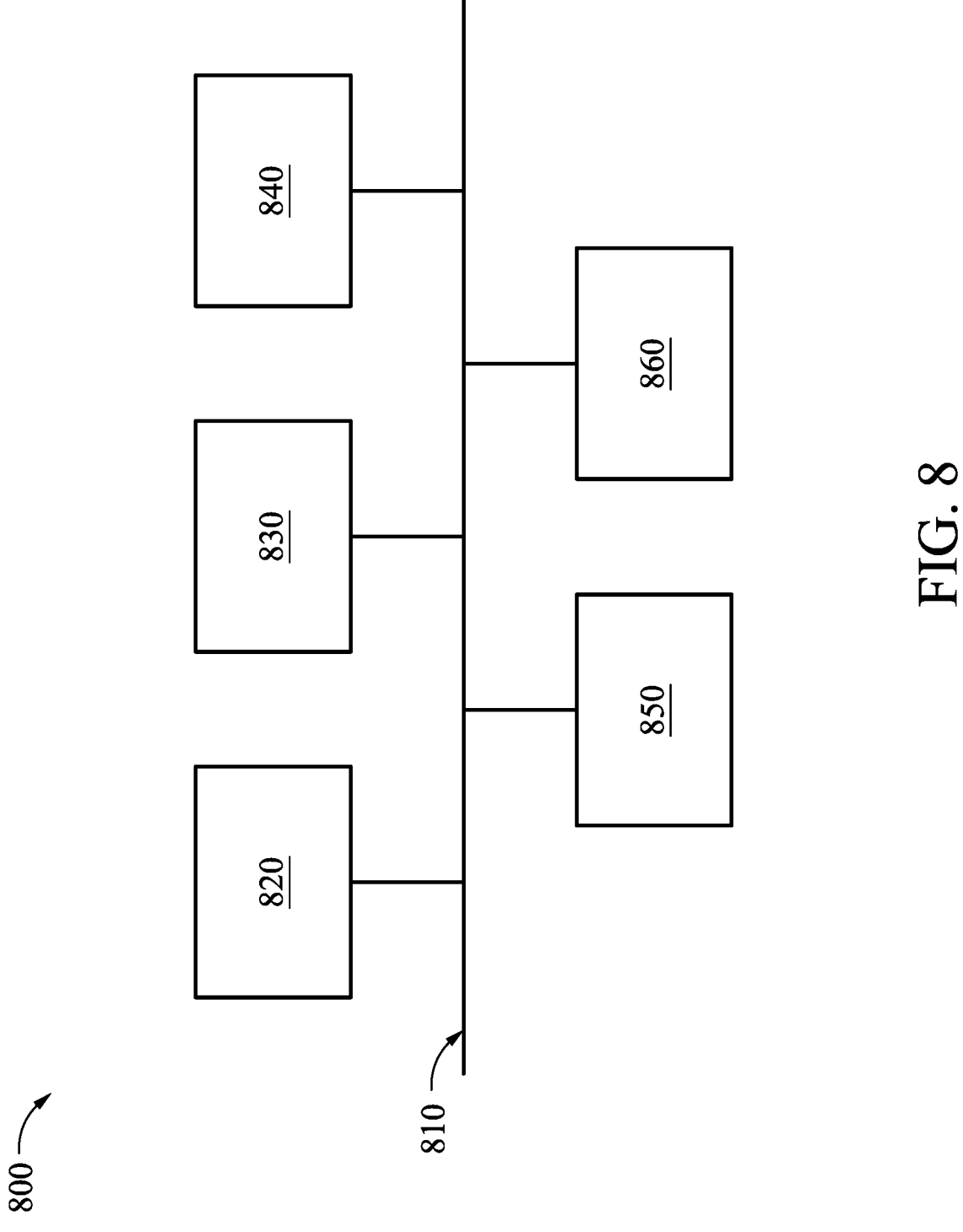
FIG. 8 is a diagram of example components of one or more devices of FIG. 1 described herein.

FIG. 8 is a diagram of example components of one or more devices of FIG. 1 described herein The device 800 may correspond to one or more of the semiconductor processing tools 102-114. In some implementations, one or more of the semiconductor processing tools 102-114 may include one or more devices 800 and/or one or more components of the device 800. As shown in FIG. 8, the device 800 may include a bus 810, a processor 820, a memory 830, an input component 840, an output component 850, and/or a communication component 860.

The bus 810 may include one or more components that enable wired and/or wireless communication among the components of the device 800. The bus 810 may couple together two or more components of FIG. 8, such as via operative coupling, communicative coupling, electronic coupling, and/or electric coupling. For example, the bus 810 may include an electrical connection (e.g., a wire, a trace, and/or a lead) and/or a wireless bus. The processor 820 may include a central processing unit, a graphics processing unit, a microprocessor, a controller, a microcontroller, a digital signal processor, a field-programmable gate array, an application-specific integrated circuit, and/or another type of processing component. The processor 820 may be implemented in hardware, firmware, or a combination of hardware and software. In some implementations, the processor 820 may include one or more processors capable of being programmed to perform one or more operations or processes described elsewhere herein.

The memory 830 may include volatile and/or nonvolatile memory. For example, the memory 830 may include random access memory (RAM), read only memory (ROM), a hard disk drive, and/or another type of memory (e.g., a flash memory, a magnetic memory, and/or an optical memory). The memory 830 may include internal memory (e.g., RAM, ROM, or a hard disk drive) and/or removable memory (e.g., removable via a universal serial bus connection). The memory 830 may be a non-transitory computer-readable medium. The memory 830 may store information, one or more instructions, and/or software (e.g., one or more software applications) related to the operation of the device 800. In some implementations, the memory 830 may include one or more memories that are coupled (e.g., communicatively coupled) to one or more processors (e.g., processor 820), such as via the bus 810. Communicative coupling between a processor 820 and a memory 830 may enable the processor 820 to read and/or process information stored in the memory 830 and/or to store information in the memory 830.

The input component 840 may enable the device 800 to receive input, such as user input and/or sensed input. For example, the input component 840 may include a touch screen, a keyboard, a keypad, a mouse, a button, a microphone, a switch, a sensor, a global positioning system sensor, an accelerometer, a gyroscope, and/or an actuator. The output component 850 may enable the device 800 to provide output, such as via a display, a speaker, and/or a light-emitting diode. The communication component 860 may enable the device 800 to communicate with other devices via a wired connection and/or a wireless connection. For example, the communication component 860 may include a receiver, a transmitter, a transceiver, a modem, a network interface card, and/or an antenna.

The device 800 may perform one or more operations or processes described herein. For example, a non-transitory computer-readable medium (e.g., memory 830) may store a set of instructions (e.g., one or more instructions or code) for execution by the processor 820. The processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, the processor 820 may be configured to perform one or more operations or processes described herein. Thus, implementations described herein are not limited to any specific combination of hardware circuitry and software.

The number and arrangement of components shown in FIG. 8 are provided as an example. The device 800 may include additional components, fewer components, different components, or differently arranged components than those shown in FIG. 8. Additionally, or alternatively, a set of components (e.g., one or more components) of the device 800 may perform one or more functions described as being performed by another set of components of the device 800.

FIG. 9 is a flowchart of an example process 900 associated with forming an example semiconductor structure described herein. In some implementations, one or more process blocks of FIG. 9 are performed by one or more of the semiconductor processing tools 102-114. In some implementations, one or more process blocks of FIG. 9 are performed by another device or a group of devices separate from or including one or more of the semiconductor processing tools 102-114. Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming, within a substrate, a first columnar structure including a first set of properties related to a first rate of thermal conduction for a temperature difference (block 910). For example, one or more of the semiconductor processing tools 102-114, such as the deposition tool 102, the exposure tool 104, the develop tool 106, and/or the etch tool 108 among other examples, may form, within a substrate 206 a first columnar structure (e.g., the columnar structure 214) including a first set of properties related to a first rate of thermal conduction for a temperature difference, as described above.

As further shown in FIG. 9, process 900 may include forming, above the substrate, a seal ring structure interspersed within one or more dielectric layers (block 920). For example, one or more of the semiconductor processing tools 102-114, such as the deposition tool 102, the exposure tool 104, the develop tool 106, and/or the etch tool 108 among other examples, may form, above the substrate 206 a seal ring structure 210 interspersed within one or more dielectric layers 318, as described above.

As further shown in FIG. 9, process 900 may include forming, adjacent to the first columnar structure, a second columnar structure including a second set of properties related to a second rate of thermal conduction for the temperature difference that is lesser relative to the first rate of thermal conduction (block 930). For example, one or more of the semiconductor processing tools 102-114, such as the deposition tool 102, the exposure tool 104, the develop tool 106, and/or the etch tool 108 among other examples, may form may form, adjacent to the first columnar structure (e.g., the columnar structure 214), a second columnar structure (e.g., the columnar structure 218) including a second set of properties related to a second rate of thermal conduction for the temperature difference that is lesser relative to the first rate of thermal conduction, as described above.

Process 900 may include additional implementations, such as any single implementation or any combination of implementations described below and/or in connection with one or more other processes described elsewhere herein.

In a first implementation, forming the seal ring structure 210 includes forming the seal ring structure 210 directly above the first columnar structure (e.g., the columnar structure 214).

In a second implementation, alone or in combination with the first implementation, forming the seal ring structure 210 includes forming the seal ring structure 210 adjacent to the first columnar structure (e.g., the columnar structure 214).

In a third implementation, alone or in combination with one or more of the first and second implementations, forming the first columnar structure (e.g., the columnar structure 214). Includes forming the first columnar structure prior to forming integrated circuitry 208 above the substrate 206.

In a fourth implementation, alone or in combination with one or more of the first through third implementations, forming the first columnar structure (e.g., the columnar structure 214) includes forming the first columnar structure subsequent to forming integrated circuitry 208 above the substrate 206.

In a fifth implementation, alone or in combination with one or more of the first through fourth implementations, forming the first columnar structure (e.g., the columnar structure 214). includes forming the first columnar structure subsequent to forming the seal ring structure 210.

In a sixth implementation, alone or in combination with one or more of the first through fifth implementations, process 900 includes joining the substrate 206 to another substrate using a direct alignment technique, where the direct alignment technique includes using a vision system 230 to detect the first columnar structure (e.g., the columnar structure 214).

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

As process technology nodes advance, however, aspect ratios associated with small diameter TSV interconnect structures (e.g., TSV interconnect structures with diameters less than approximately 6 microns) introduce challenges with maintaining or increasing a thickness of the silicon substrate for thermal performance requirements. Additionally, such small diameters may decrease thermal conductivity of the TSV interconnect structures relative to large diameter TSV interconnect structures (e.g., TSV interconnect structures with diameters greater than approximately 10 microns).

Some implementations described herein include systems and techniques for fabricating a multi-dimension TSV structure in a 3DIC device. The multi-dimension TSV structure includes a first columnar structure having a first width and a second columnar structure including a second width that is greater relative to the first width. The first columnar structure may include a low electrical capacitance and be configured for electrical signaling within the 3DIC device. The second columnar structure may be configured to provide power to integrated circuitry of the 3DIC device and also be configured to conduct heat through the 3DIC device for thermal management of the 3DIC device.

Some implementations described herein include systems and techniques for fabricating a multi-dimension TSV structure in a 3DIC device. The multi-dimension TSV structure includes a first columnar structure having a first width and a second columnar structure including a second width that is greater relative to the first width. The first columnar structure may include a low electrical capacitance and be configured for electrical signaling within the 3DIC device. The second columnar structure may be configured to provide power to integrated circuitry of the 3DIC device and also be configured to conduct heat through the 3DIC device for thermal management of the 3DIC device. Additionally, a pattern including the second columnar structure may be used for alignment purposes.

Using the multi-dimension TSV structure including the first and second columnar structures may increase a rate of heat transfer from the 3DIC device relative to another 3DIC device including a single-dimension TSV structure that is designed for electrical signaling. In this way, the 3DIC device may realize an increase in a thermal performance (e.g., maintain a junction temperature under a high-temperature operating condition, maintain a computing rate under a high-temperature operating condition, and/or experience a prolonged useful life, among other examples). Further, a location of the second columnar structure may allow a size of the 3DIC device to be reduced, and a pattern including the second columnar structure may be used for alignment purposes. Such a reduction in the size of the 3DIC device, and/or use of the pattern for alignment purposes, may translate into to a reduction in resources (e.g., manufacturing tools, materials, and or computing resources, among other examples) required to produce a volume of 3DIC devices relative to a volume of 3DIC devices not including the multi-dimension TSV structure.

As described in greater detail above, some implementations described herein provide a method. The method includes forming, within a substrate, a first columnar structure including a first set of properties related to a first rate of thermal conduction for a temperature difference. The method includes forming, above the substrate, a seal ring structure interspersed within one or more dielectric layers. The method includes forming, adjacent to the first columnar structure, a second columnar structure including a second set of properties related to a second rate of thermal conduction that is lesser relative to the first rate of thermal conduction.

As described in greater detail above, some implementations described herein provide a device. The device includes a substrate. The device includes one or more first dielectric layers above the substrate. The device includes one or more second dielectric layers above the one or more first dielectric layers. The device includes a seal ring structure interspersed with the one or more second dielectric layers. The device includes one or more third dielectric layers above the one or more second dielectric layers. The device includes a first columnar structure penetrating into the substrate adjacent to the seal ring structure. The first columnar structure includes a first side adjacent to the seal ring structure and a first top surface above a first approximate plane, where the first approximate plane corresponds to an upper surface of the substrate. The first columnar structure includes a first set of properties related to a first rate of thermal conduction for a temperature difference. The device includes a second columnar structure penetrating into the substrate adjacent a second side of the first columnar structure that is opposite the first side. The second columnar structure includes a second top surface in, or above, a second approximate plane, where the second approximate plane corresponds to an upper surface of the one or more third dielectric layers. The columnar structure includes a second set of properties related to a second rate of thermal conduction for the temperature difference, where the second rate of thermal conduction is lesser relative to the first rate of thermal conduction.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

As described in greater detail above, some implementations described herein provide a device. The device includes a substrate. The device includes a seal ring structure above the substrate. The device includes a dielectric layer above the seal ring structure above the substrate. The device includes a first columnar structure penetrating into the substrate adjacent to the seal ring structure. The first seal columnar structure includes first top surface in a first approximate plane corresponding to an upper surface of the substrate. The device includes a second columnar structure adjacent to a first side of the first columnar structure and penetrating into the substrate directly below the seal ring structure. The second columnar structure includes a second top surface in the first approximate plane. The device includes a third columnar structure penetrating into the substrate adjacent a second side of the first columnar structure that is opposite the first side. The third columnar structure includes a third top surface in, or above, a third approximate plane corresponding to an upper surface of the dielectric layer.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming, within a substrate, a first columnar structure comprising a first set of properties related to a first rate of thermal conduction for a temperature difference;
forming, above the substrate, a seal ring structure interspersed within one or more dielectric layers, wherein the first columnar structure further comprises a first side adjacent to, or underlying, the seal ring structure; and
forming, adjacent to the first columnar structure, a second columnar structure comprising a second set of properties, related to a second rate of thermal conduction for the temperature difference that is lesser relative to the first rate of thermal conduction, and comprising a second top surface in, or above, an approximate plane that corresponds to an upper surface of the substrate, wherein the second columnar structure is adjacent to a second side of the first columnar structure that is opposite from the first side.

2. The method of claim 1, wherein forming the seal ring structure comprises:
forming the seal ring structure directly above the first columnar structure.

3. The method of claim 1, wherein forming the seal ring structure comprises:
forming the seal ring structure adjacent to the first columnar structure.

4. The method of claim 1, wherein forming the first columnar structure comprises:
forming the first columnar structure prior to forming integrated circuitry above the substrate.

5. The method of claim 1, wherein forming the first columnar structure comprises:
forming the first columnar structure subsequent to forming integrated circuitry above the substrate.

6. The method of claim 1, wherein forming the first columnar structure comprises:

forming the first columnar structure subsequent to forming the seal ring structure.

7. The method of claim 1, further comprising:
joining the substrate to another substrate using a direct alignment technique,
wherein the direct alignment technique includes using a vision system to detect the first columnar structure.

8. A device, comprising:
a substrate;
one or more first dielectric layers above the substrate;
one or more second dielectric layers above the one or more first dielectric layers;
a seal ring structure interspersed with the one or more second dielectric layers;
one or more third dielectric layers above the one or more second dielectric layers;
a first columnar structure penetrating into the substrate adjacent to the seal ring structure and comprising:
a first side adjacent to the seal ring structure;
a first top surface above a first approximate plane, wherein the first approximate plane corresponds to an upper surface of the substrate; and
a first set of properties related to a first rate of thermal conduction for a temperature difference; and
a second columnar structure penetrating into the substrate adjacent to a second side of the first columnar structure that is opposite the first side and comprising:
a second top surface in, or above, a second approximate plane,
wherein the second approximate plane corresponds to an upper surface of the one or more third dielectric layers; and
a second set of properties related to a second rate of thermal conduction for the temperature difference,
wherein the second rate of thermal conduction is lesser relative to the first rate of thermal conduction.

9. The device of claim 8, wherein the first top surface is in a third approximate plane corresponding to the upper surface of the one or more first dielectric layers.

10. The device of claim 8, wherein the first top surface is in, or above, the second approximate plane corresponding to the upper surface of the one or more third dielectric layers.

11. The device of claim 8, wherein the first columnar structure is included in a first row of columnar structures adjacent to integrated circuitry, and
wherein the second columnar structure is included in a second row of columnar structures above the integrated circuitry.

12. The device of claim 8, wherein from a top view perspective the first columnar structure includes an approximately rectangular shape.

13. The device of claim 8, further comprising:
a pattern of columnar structures comprising a third columnar structure that penetrates the substrate,
wherein the pattern of columnar structures is configured to be detectable by a vision system of a semiconductor processing tool, and
wherein the third columnar structure comprises:
a width that is approximately equal to a width of the first columnar structure.

14. A device, comprising:
a substrate;
a seal ring structure above the substrate;
a dielectric layer above the seal ring structure above the substrate;

a first columnar structure penetrating into the substrate adjacent to the seal ring structure and comprising:

a first top surface in a first approximate plane corresponding to an upper surface of the substrate;

a second columnar structure adjacent to a first side of the first columnar structure and penetrating into the substrate directly below the seal ring structure and comprising:

a second top surface in the first approximate plane; and a third columnar structure penetrating into the substrate adjacent a second side of the first columnar structure that is opposite the first side and comprising:

a third top surface in, or above, a third approximate plane corresponding to an upper surface of the dielectric layer.

15. The device of claim 14, wherein the first columnar structure comprises:

a first width, and wherein the second columnar structure comprises a second width that is approximately equivalent to the first width.

16. The device of claim 14, further comprising:

a metallization structure, and wherein the third columnar structure is between the first columnar structure and the metallization structure.

17. The device of claim 14, wherein from a top view perspective one or more of the first columnar structure, the second columnar structure, or the third columnar structure includes an approximately round shape.

18. The device of claim 14, wherein the first columnar structure and/or the second columnar structure is connected to a power source providing power to the device, and wherein a first electrical capacitance of the first columnar structure and/or a second electrical capacitance of the second columnar structure is greater relative to a third electrical capacitance of the third columnar structure.

19. The device of claim 14, wherein the first columnar structure comprises a first width, wherein the second columnar structure comprises a second width, and wherein the third columnar structure comprises a third width that is lesser relative to the first width and lesser relative to the second width.

20. The device of claim 19, wherein a ratio of a greater width corresponding to the first width, and/or the second width, to a lesser width corresponding to the third width is greater than or equal to approximately 5:3.

\* \* \* \* \*